(12) United States Patent
Gu et al.

(10) Patent No.: US 12,216,498 B2
(45) Date of Patent: Feb. 4, 2025

(54) ELECTRONIC DEVICE INCLUDING ANTENNA AND CABLE STRUCTURE

(71) Applicant: SAMSUNG ELECTRONICS CO., LTD., Suwon-si (KR)

(72) Inventors: Yeonghun Gu, Suwon-si (KR); Keunpyo Park, Suwon-si (KR); Youngho Park, Suwon-si (KR); Jiwoo Lee, Suwon-si (KR); Kio Jung, Suwon-si (KR); Ko Choi, Suwon-si (KR); Woojin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 17/989,316

(22) Filed: Nov. 17, 2022

(65) Prior Publication Data

US 2023/0100675 A1 Mar. 30, 2023

Related U.S. Application Data

(63) Continuation of application No. PCT/KR2022/014629, filed on Sep. 29, 2022.

(30) Foreign Application Priority Data

Sep. 30, 2021 (KR) .................. 10-2021-0129704
Dec. 2, 2021 (KR) .................. 10-2021-0171224

(51) Int. Cl.
*G06F 1/16* (2006.01)
*H05K 7/14* (2006.01)

(52) U.S. Cl.
CPC .......... *G06F 1/1641* (2013.01); *G06F 1/1681* (2013.01); *G06F 1/1698* (2013.01); *H05K 7/1427* (2013.01)

(58) Field of Classification Search
CPC .... G06F 1/1641; G06F 1/1681; G06F 1/1698; H05K 7/1427; H01Q 1/2266; H01Q 1/48; H01Q 9/0414
See application file for complete search history.

(56) References Cited

U.S. PATENT DOCUMENTS

| 7,492,321 | B2 | 2/2009 | Park |
| 8,493,270 | B2 | 7/2013 | Hikino |
| | | (Continued) | |

FOREIGN PATENT DOCUMENTS

| JP | 2009-044224 | 2/2009 |
| KR | 1999-001981 | 1/1999 |
| | (Continued) | |

OTHER PUBLICATIONS

Search Report dated Dec. 14, 2022 in International Patent Application No. PCT/KR2022/014629.

(Continued)

*Primary Examiner* — Daniel C Puentes
*Assistant Examiner* — Peter Krim
(74) *Attorney, Agent, or Firm* — Nixon & Vanderhye, P.C.

(57) ABSTRACT

An electronic device according to various embodiments of the disclosure may include a first housing on which a first printed circuit board including a processor is disposed, a second housing on which a second printed circuit board including a display driver for a display is disposed, a hinge structure configured to physically connect the first housing and the second housing such that the first housing and the second housing are foldable/unfoldable, and a cable structure configured to electrically connect the first printed circuit board and the second printed circuit board via the hinge structure. The cable structure may include a first cable configured to transfer display signals and a second cable (Continued)

branched off from the first cable to be grounded to the hinge structure.

20 Claims, 28 Drawing Sheets

(56) References Cited

U.S. PATENT DOCUMENTS

| | | | |
|---|---|---|---|
| 9,557,278 B1* | 1/2017 | Itagi | G01N 15/1031 |
| 11,287,855 B2 | 3/2022 | Kim et al. | |
| 2005/0030233 A1 | 2/2005 | Kim et al. | |
| 2005/0079748 A1* | 4/2005 | Kim | H05K 3/325 |
| | | | 439/92 |
| 2008/0266198 A1 | 10/2008 | Walker et al. | |
| 2009/0176541 A1 | 7/2009 | Okajima | |
| 2011/0205129 A1 | 8/2011 | Koshi et al. | |
| 2015/0153788 A1 | 6/2015 | Shiroishi et al. | |
| 2018/0116063 A1* | 4/2018 | Tracy | H05K 7/02 |
| 2020/0183465 A1 | 6/2020 | Yoo et al. | |
| 2020/0326754 A1* | 10/2020 | Kim | G09F 9/301 |
| 2021/0247806 A1* | 8/2021 | Lee | G06F 1/1683 |
| 2022/0069437 A1* | 3/2022 | Yoo | H01Q 1/2266 |
| 2022/0183173 A1* | 6/2022 | Kim | H05K 9/0084 |
| 2023/0029875 A1* | 2/2023 | Tan | G06F 1/203 |

FOREIGN PATENT DOCUMENTS

| | | |
|---|---|---|
| KR | 10-0539935 | 12/2005 |
| KR | 20-0426917 Y1 | 9/2006 |
| KR | 10-0685212 | 2/2007 |
| KR | 10-1098658 | 5/2007 |
| KR | 10-2008-0098942 | 11/2008 |
| KR | 10-2011-0034283 | 4/2011 |
| KR | 10-2020-0068382 | 6/2020 |
| WO | 2008-133992 | 11/2008 |

OTHER PUBLICATIONS

Written Opinion dated Dec. 14, 2022 in International Patent Application No. PCT/KR2022/014629.

Extended Search Report dated Nov. 20, 2024 in European Patent Application No. 22876882.6.

* cited by examiner

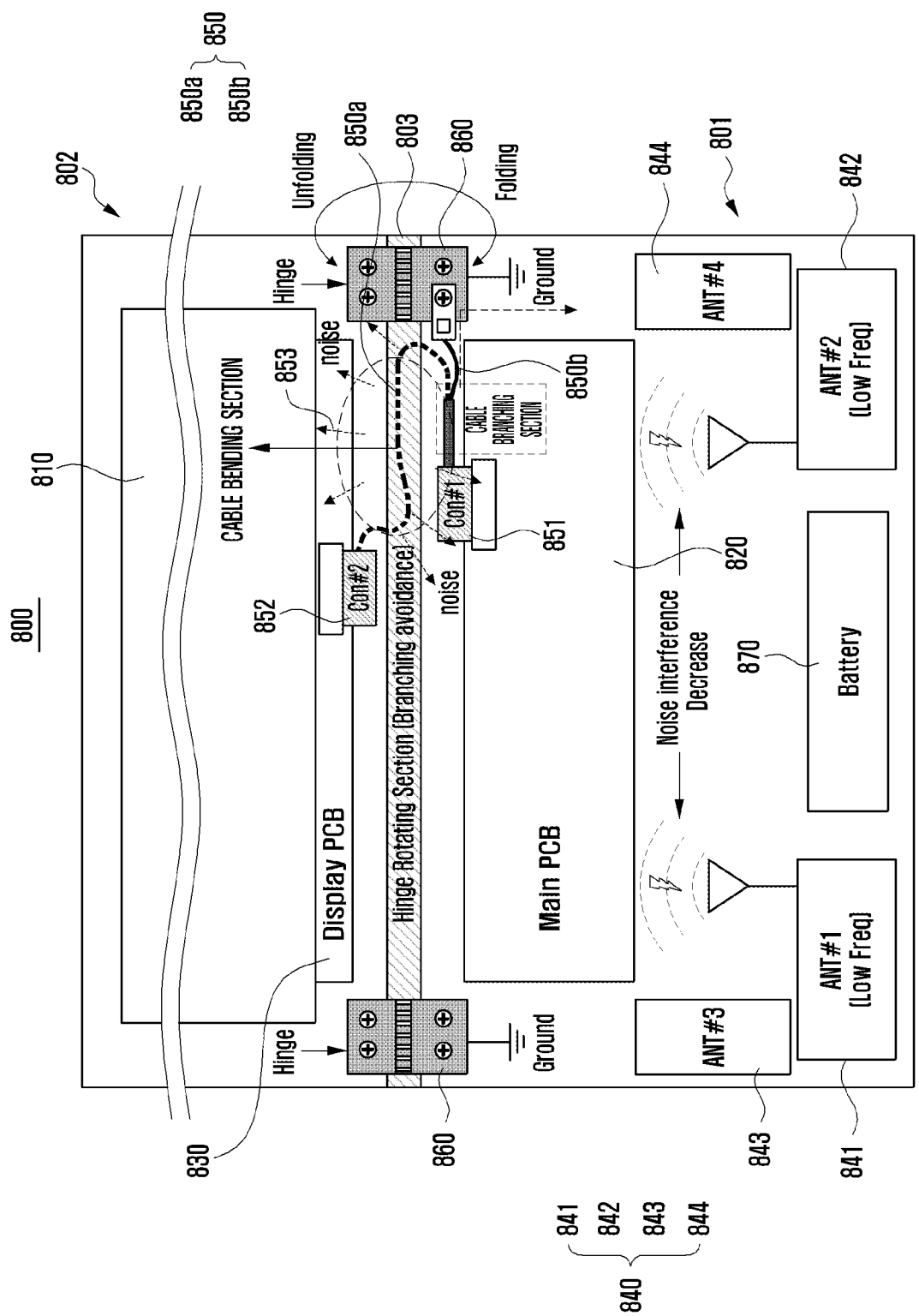

ELECTRONIC DEVICE INCLUDING ANTENNA AND CABLE STRUCTURE

CROSS-REFERENCE TO RELATED APPLICATIONS

This application is based on and claims priority under 35 U.S.C. § 120 to PCT International Application No. PCT/KR2022/014629, which was filed on Sep. 29, 2022, and claims priority to Korean Patent Application No. 10-2021-0129704 filed on Sep. 30, 2021, and Korean Patent Application No. 10-2021-0171224 filed on Dec. 2, 2021 in the Korean Intellectual Property Office, the disclosure of which are incorporated by reference herein their entirety.

BACKGROUND

Field

Various embodiments of the disclosure relate to an electronic device including an antenna and a cable structure.

Description of Related Art

An electronic device (for example, portable PC, tablet PC, portable wireless communication device) including a large-screen display may have two housings (for example, bodies) physically connected by at least one hinge structure (for example, hinge assembly). A second housing (for example, display housing) having a display disposed thereon may be positioned on a first housing (for example, main housing) including electronic components (for example, processor, memory), and the first and second housings may be folded so as to face each other, or unfolded. A first printed circuit board (for example, main printed circuit board) disposed on the first housing and a second printed circuit board (for example, display printed circuit board) disposed on the second housing may be electrically connected through a cable extending through the hinge structure.

SUMMARY

Display signals (for example, input device camera video signals and microphone audio signals) from the first printed circuit board (for example, main printed circuit board) disposed on the first housing may be transferred to the second printed circuit board (for example, display printed circuit board) disposed on the second housing through a display cable. The display cable may have a length of 8-12 cm in view of a flexible section for accommodating the folding/unfolding of the first and second housings. When the electronic device (for example, portable PC, tablet PC, portable wireless communication device) operates, the display cable having a length of 8-12 cm may generate parasitic resonance in an RF Low-Band frequency range (600-900 MHz). The parasitic resonance generated by the display cable in the RF Low-Band frequencies may act as noise, thereby degrading the performance of the RF module of the RF Low-Band. Various embodiments of the disclosure may provide an electronic device capable of reducing or preventing the occurrence of parasitic resonance, thereby reducing or preventing performance degradation of the RF module.

Technical problems to be solved by the disclosure are not limited to the above-mentioned technical problems, and other technical problems not mentioned herein will be clearly understood from the following description by those skilled in the art to which the disclosure pertains.

An electronic device according to various embodiments of the disclosure may include a first housing on which a first printed circuit board including a processor is disposed, a second housing on which a second printed circuit board including display driver for a display is disposed, a hinge structure configured to physically connect the first housing and the second housing such that the first housing and the second housing are foldable/unfoldable, and a cable structure extending through the hinge structure and configured to electrically connect the first printed circuit board and the second printed circuit board. The cable structure may include a first cable configured to transfer display signals and a second cable branched off from the first cable to be grounded to the hinge structure.

An electronic device according to various embodiments of the disclosure may include a first housing on which a first printed circuit board including a processor is disposed, a heat dissipation member disposed on the first housing so as to dissipate heat of the first printed circuit board, a second housing on which a second printed circuit board including a display driver for a display is disposed, a hinge structure configured to physically connect the first housing and the second housing such that the first housing and the second housing are foldable/unfoldable, and a cable structure extending through the hinge structure and configured to electrically connect the first printed circuit board and the second printed circuit board. The cable structure may include a first cable configured to transfer display signals and a second cable branched off from the first cable to be grounded to the heat dissipation member.

An electronic device according to various embodiments of the disclosure may have a cable structure grounded to a hinge structure or a heat dissipation member such that the ground path of the cable structure is shortened. By shortening the ground path of the cable structure, the frequency band of parasitic resonance occurring in the cable structure may be shifted to an out band (for example, 1,000-1,500 MHz) (e.g., a frequency band not supported by the electronic device). By shifting the frequency band of parasitic resonance occurring in the cable structure, performance degradation of the communication module for RF Low-Band communication may be prevented.

Various other advantageous effects identified explicitly or implicitly through the disclosure may be provided.

BRIEF DESCRIPTION OF THE DRAWINGS

FIG. 8 is a view illustrating an example electronic device according to various embodiments of the disclosure.

DETAILED DESCRIPTION

Figure 1:
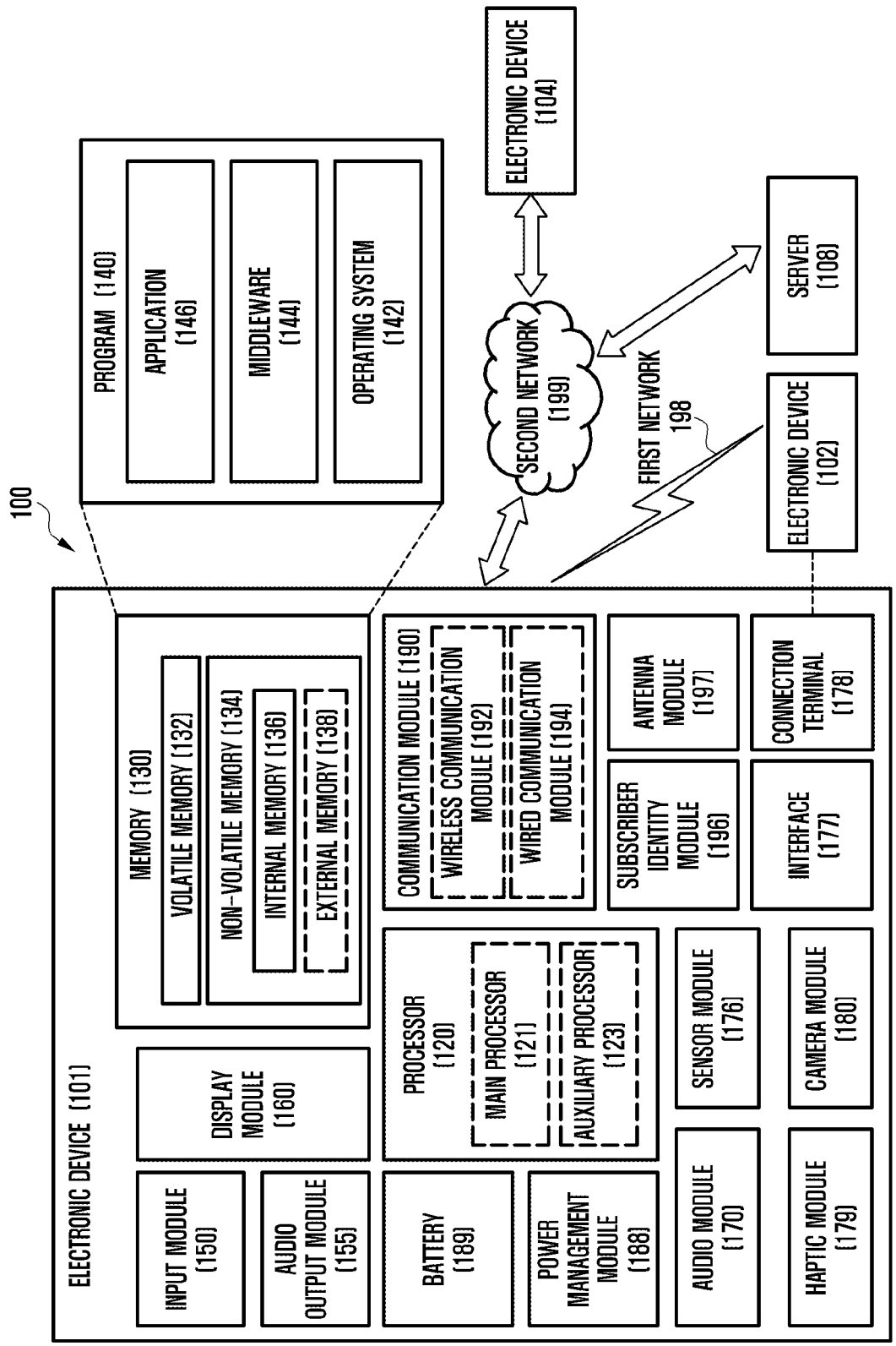
FIG. 1 is a block diagram illustrating an example electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, an audio output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In various embodiments, at least one of the components (e.g., the connection terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the audio output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module (SIM) 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, the display module 160 may include a flexible display configured to be folded or unfolded.

According to an embodiment, the display module 160 may include a flexible display providing a slidably arranged screen (for example, a display screen).

According to an embodiment, the display module 160 may be also referred to as a variable display (for example, a stretchable display), an expandable display, or a slide-out display.

According to an embodiment, the display module 160 may include a bar type or plate type display.

Figure 2:
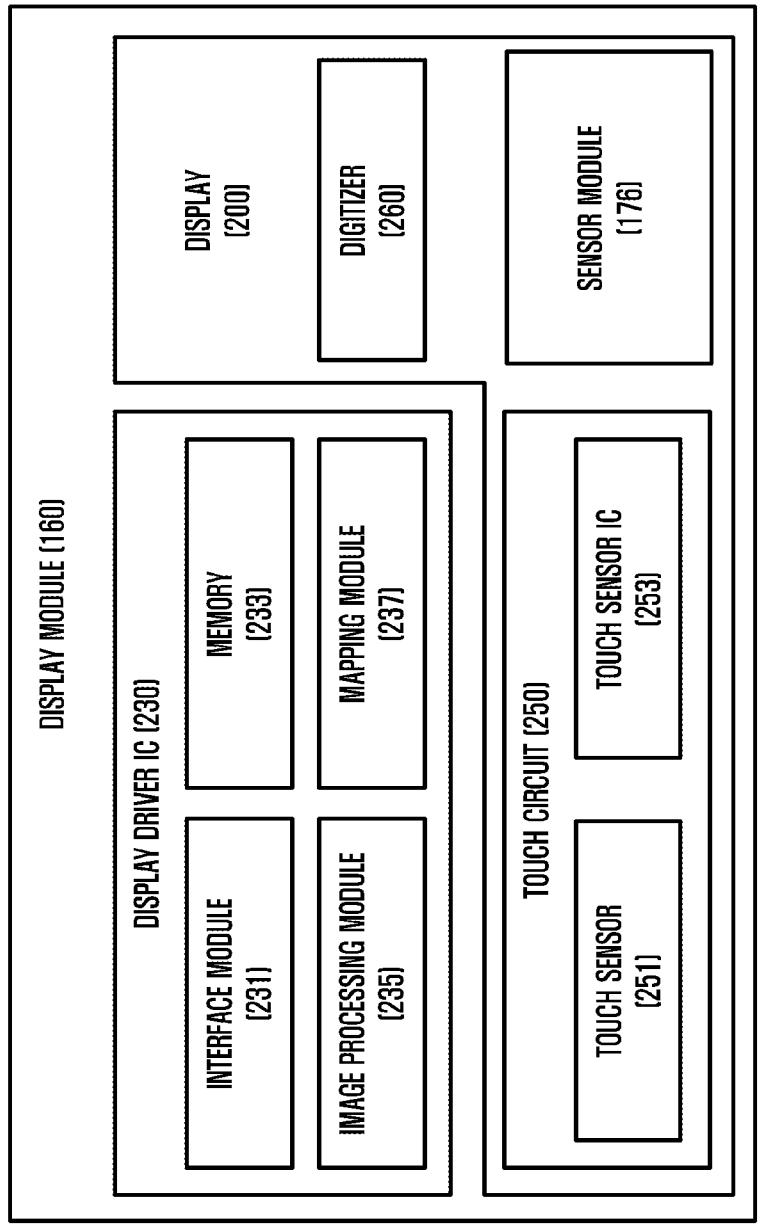
FIG. 2 is a block diagram illustrating an example display module according to various embodiments.

FIG. 2 is a block diagram illustrating an example display module 160 according to various embodiments.

Referring to FIG. 2, the display module 160 may include a display 200 and a display driver IC 230 (hereinafter, referred to as "DDI 230") for controlling the display 200. The DDI 230 may include an interface module 231, a memory 233 (for example, a buffer memory), an image processing module 235, and/or a mapping module 237.

According to an embodiment, the DDI 230 may receive image data or image information including an image control signal corresponding to a command for controlling the image data from another component of the electronic device 101 through the interface module 231.

According to an embodiment, the image information may be received from a processor (for example, the processor 120 in FIG. 1) (for example, the main processor 121 in FIG. 1) (for example, an application processor) or an auxiliary processor (for example, the auxiliary processor 123 in FIG. 1) (for example, a graphic processing device) operating independently from a function of the main processor 121.

According to an embodiment, the DDI 230 may perform communication with a touch circuit 250 or a sensor module 176 through the interface module 231. In addition, the DDI 230 may store at least a portion of the received image information in the memory 233. By way of example, the DDI 230 may store at least a portion of the received image information in the memory 233 in a unit of frame.

According to an embodiment, the image processing module 235 may perform a preprocessing or post-processing (for example, resolution, brightness, or size adjustment) on at least a portion of the image data based on characteristics of the image data or a characteristic of the display 200.

According to an embodiment, the mapping module 237 may generate a voltage value or current value corresponding to the image data having been preprocessed or post-processed by the image processing module 235. As an embodiment, the generation of the voltage value or current value may be performed at least partially based on attributes (for example, an arrangement (RGB stripe or pentile structure) of pixels or a size of each pixel) of pixels of the display 200.

In an embodiment, at least some of the pixels of the display 200 may be driven based on the voltage value and current value and thus visual information (for example, a text, image, and/or icon) corresponding to the image data may be displayed through the display 200.

According to an embodiment, the display module 160 may further include a touch circuit 250. The touch circuit 250 may include a touch sensor 251 and a touch sensor IC 253 for controlling the touch sensor.

As an embodiment, the touch sensor IC 253 may control the touch sensor 251 to detect a touch input or a hovering input for a predetermined position of the display 200. For example, the touch sensor IC 253 may measure a change in a signal (for example, a voltage, light amount, resistance, or voltage amount) for a predetermined position of the display 200 to detect a touch input or a hovering input. The touch sensor IC 253 may provide information on the detected touch input or hovering input (for example, a position, area, pressure, or time) to the processor (for example, the processor 120 in FIG. 1).

According to an embodiment, at least a portion (for example, the touch sensor IC 253) of the touch circuit 250 may be included as a portion of the display driver IC 230 or the display 200.

According to an embodiment, at least a portion (for example, the touch sensor IC 253) of the touch circuit 250 may be included as a portion of other components (for example, the auxiliary processor 123) disposed outside the display module 160.

According to an embodiment, the display module 160 may include at least one sensor (for example, an expansion detection sensor, fingerprint sensor, iris sensor, pressure sensor, or illuminance sensor) of the sensor module 176 or a control circuit therefor. In this case, the at least one sensor or the control circuit therefor may be embedded as a portion (for example, the display 200 or the DDI 230) of the display module 160 or a portion of the touch circuit 250. For example, when the embedded sensor module 176 of the display module 160 includes a biosensor (for example, a fingerprint sensor), the biosensor may obtain bio-information (for example, a fingerprint image) related to a touch input through a partial area of the display 200. For another example, when the embedded sensor module 176 of the display module 160 includes a pressure sensor, the pressure sensor may obtain input information related to a touch input through a partial area or the whole area of the display 200. For another example, when the embedded sensor module 176 of the display module 160 includes an expansion detection sensor, the expansion detection sensor may sense a change in area (for example, a size of a screen) of the display (for example, a variable display). According to an embodiment, the touch sensor 251 or the sensor module 176 may be disposed between pixels of a pixel layer of the display 200 or disposed on or under the pixel layer.

According to an embodiment, the display 200 may include a digitizer 260 for detecting an input (for example, a touch input or hovering input) of an input device (for example, a stylus pen). The digitizer 260 may convert analog coordinates of an input device (for example, a stylus pen) into digital data and transfer the digital data to the processor (for example, the processor 120 in FIG. 1). The processor (for example, the processor 120 in FIG. 1) may detect an input (for example, a touch input or hovering input) through an input device (for example, stylus pen) based on the digital data received from the digitizer 260.

Figure 3A:
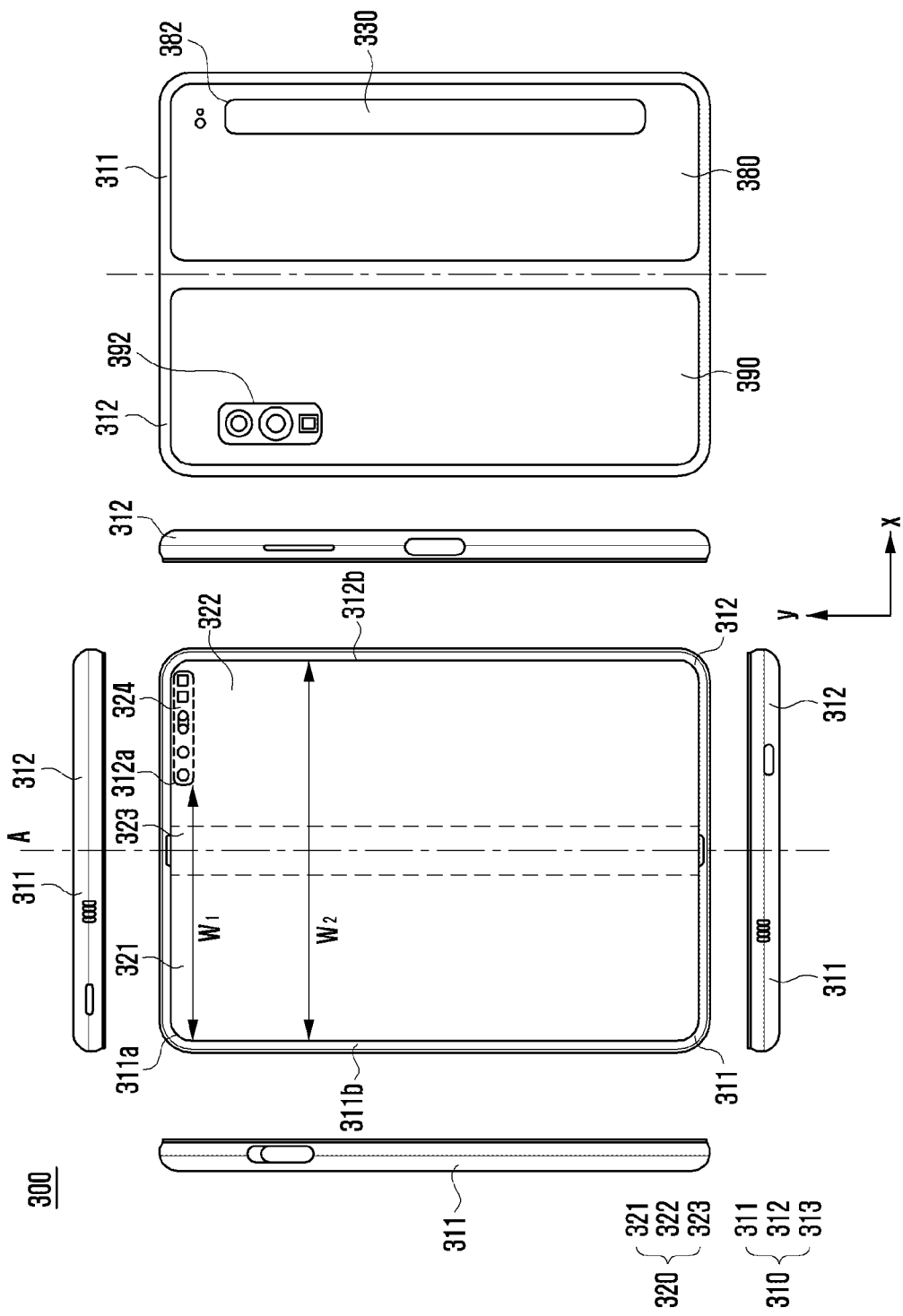
FIG. 3A is a view illustrating a first state (for example, an unfolded state or open state) of an example electronic device according to various embodiment of the disclosure.
Figure 3B:
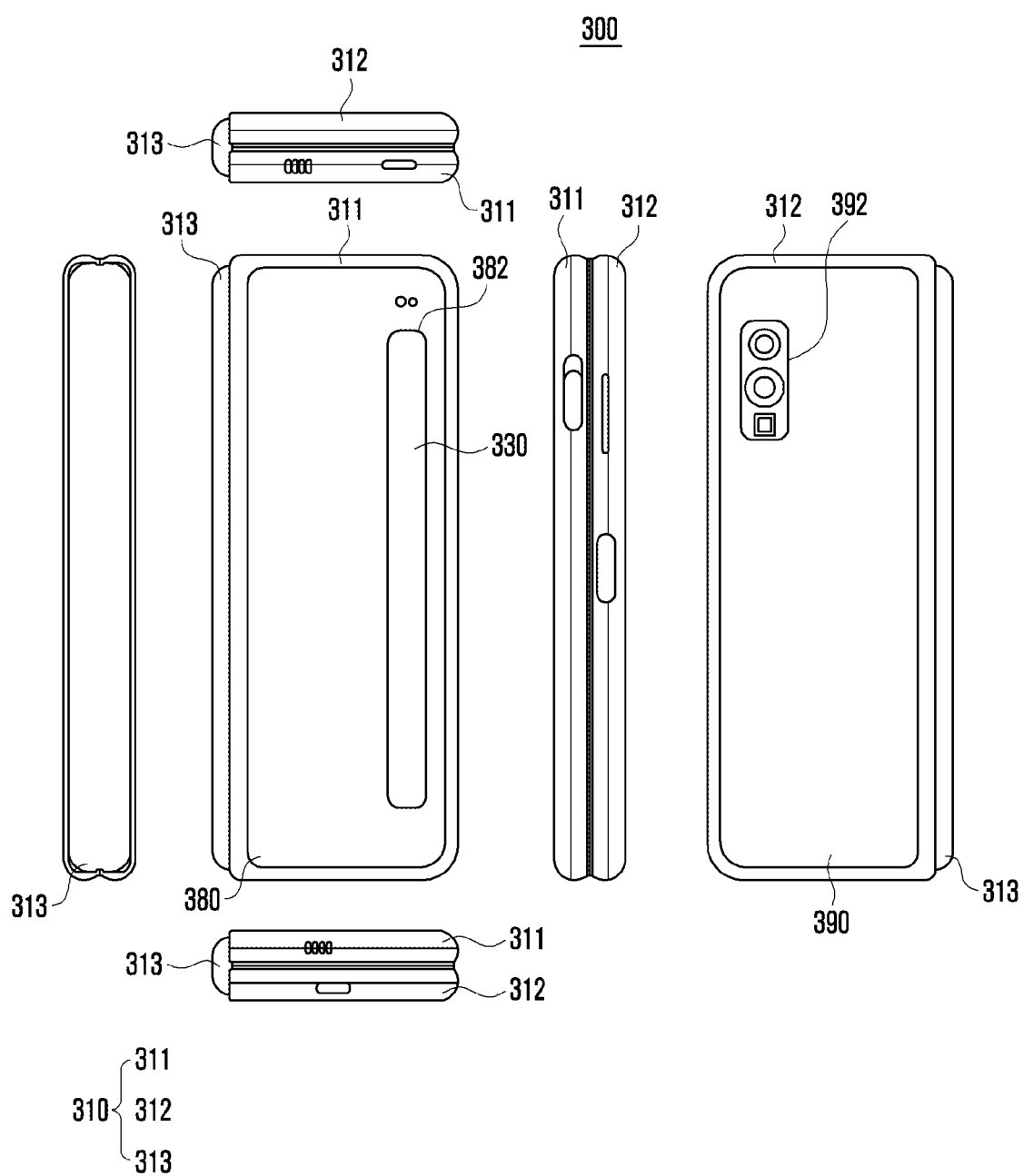
FIG. 3B is a view illustrating a second state (for example, a folded state or closed state) of an example electronic device according to various embodiment of the disclosure.

FIG. 3A is a view illustrating a first state (for example, an unfolded state or open state) of an example electronic device according to various embodiments of the disclosure. FIG. 3B is a view illustrating a second state (for example, a folded state or closed state) of an example electronic device according to various embodiments of the disclosure.

Referring to FIG. 3A and FIG. 3B, an electronic device 300 (for example, the electronic device 101 in FIG. 1) may include a housing 310 and a display 320 disposed in a space formed by the housing 310. As an embodiment, the display 320 may include a flexible display or a foldable display.

The surface in which the display 320 is disposed may be defined as a first surface or a front surface (for example, a surface becoming a screen when unfolded) of the electronic device 300. And the opposite surface thereof may be defined as a second surface or a rear surface of the electronic device 300. In addition, a surface surrounding a space between the front surface and the rear surface may be defined as a lateral surface of the electronic device 300. For example, the electronic device 300 may include a folding area 323 for folding the display around a folding axis (for example, A-axis).

In an embodiment, the housing 310 may include a first housing structure 311, a second housing structure 312 including a sensor area 324, and a hinge structure 313. In addition, the housing 310 may include a first rear cover 380 and a second rear cover 390. The housing 310 of the electronic device 300 is not limited to the shape and combination shown in FIG. 3A and FIG. 3B, and may be implemented by other shapes or combinations and/or coupling of components. For example, in an embodiment, the first housing structure 311 and the first rear cover 380 may be integrally formed and the second housing structure 312 and the second rear cover 390 may be integrally formed.

In an embodiment, the first housing structure 311 and the second housing structure 312 are arranged opposite sides around a folding axis A and have generally symmetric shapes with respect to the folding axis A. An angle and distance between the first housing structure 311 and the second housing structure 312 may vary according to whether the electric device 300 is in an unfolded state (for example, a first state), a folded state (for example, a second state), or an intermediate state (for example, a third state) between the folded state and the unfolded state.

As an embodiment, the second housing structure 312, unlike the first housing structure 311, may additionally include the sensor area 324 in which various sensors (for example, an illuminance sensor, iris sensor, and/or image sensor) are disposed, but may have a symmetrical shape to the first housing structure in other areas.

As an embodiment, in addition to the sensor area 324, at least one sensor (for example, a camera module, illuminance sensor, iris sensor, and/or image sensor) may be disposed under the display and/or on a bezel area.

As an embodiment, the first housing structure 311 and the second housing structure 312 may together form a recess for receiving the display 320. In the embodiment shown in the drawing, the recess may have two or more different widths in a direction (for example, x-axis direction) perpendicular to the folding axis A due to the sensor area 324.

For example, the recess may have a first width $W_1$ between a first part 311*a* of the first housing structure 311 and a first part 312*a* of the second housing structure 312 formed at edge of the sensor area 324 in the second housing structure 312. The recess may have a second width $W_2$ formed by a second part 311*b* of the first housing structure 311 and a second part 312*b* of the second housing structure 312. For example, the second part 311*b* of the first housing structure 311 may be formed in parallel with a folding axis A in the first housing structure 311. The second part 312*b* of the second housing structure 312 may be formed in parallel with a folding axis A while not corresponding to the sensor area 324 in the second housing structure 312. In this case, the second width $W_2$ may be formed to be wider than the first width $W_1$. In other words, the first part 311*a* of the first housing structure 311 and the first part 312*a* of the second housing structure 312 which have asymmetric shapes may form the first width $W_1$ of the recess. The second part 311*b* of the first housing structure 311 and the second part 312*b* of the second housing structure 312 which have symmetric shapes may form the second width $W_2$ of the recess.

As an embodiment, the first portion 312*a* and the second portion 312*b* of the second housing structure 312 may have different distances from the folding axis A. The width of the recess is not limited to the embodiments described above. In various embodiments, the recess may have multiple widths due to the shape of the sensor area 324 or an asymmetric shaped portion of the first housing structure 311 and the second housing structure 312.

As an embodiment, at least a portion of the first housing structure 311 and the second housing structure 312 may be formed of a metal or non-metal material having a selected magnitude of strength for supporting the display 320.

As an embodiment, the sensor area 324 may be formed to have a predetermined area adjacent to one side corner of the second housing 312. However, the disposition, shape, and size of the sensor area 324 is not limited to the embodiment described above. For example, in another embodiment, the sensor area 324 may be provided at a different corner or at a predetermined area between the upper corner and the lower corner of the second housing structure 312.

As an embodiment, components embedded in the electronic device 300 for performing various functions may be exposed to the front side of the electronic device 300 through the sensor area 324 or one or more openings formed through the sensor area 324. In various embodiments, the components may include various sensors. The sensors may include, for example, at least one of an illuminance sensor, a front camera (for example, a camera module), a receiver, or a proximity sensor.

The first rear cover 380 may be disposed on one side of the folding axis A on the rear surface of the electronic device 300, and have, for example, a substantially rectangular periphery which may be surrounded by the first housing structure 311. Similarly, the second rear cover 390 may be disposed on the other side of the folding axis A on the rear surface of the electronic device 300, and may have a periphery surrounded by the second housing structure 312.

In an embodiment shown in the Figures, the first rear cover 380 and the second rear cover 390 may have substantially symmetrical shapes to each other with reference to the folding axis A. However, the first rear cover 380 and the second rear cover 390 are not limited to having symmetric shapes and, in various embodiments, the electronic device 300 may include a first rear cover and a second rear cover having various shapes. In an embodiment, the first rear cover 380 and the first housing structure 311 may be integrally formed and the second rear cover 390 and the second housing structure 312 may be integrally formed.

As an embodiment, the first rear cover 380, the second rear cover 390, the first housing structure 311, and the second housing structure 312 may form a space in which various components (for example, a printed circuit board or a battery) of the electronic device 300 may be arranged. As an embodiment, one or more components may be arranged at or visually exposed through the rear surface of the electronic device 300. For example, at least a portion of a sub display 330 may be visually exposed through a first rear area 382 of the first rear cover 380. For another example, one or more components or sensors may be visually exposed through the second rear area 392 of the second rear cover 390. In various embodiments, the sensor may include an illuminance sensor, a proximity sensor and/or a rear camera.

As an embodiment, the hinge structure 313 may include a hinge and a hinge cover. The hinge structure 313 may be disposed between the first housing structure 311 and the second housing structure 312. The hinge cover may be formed to be capable of covering an internal component (for example, a hinge structure). The hinge structure 313 may cover a portion in which the first housing structure 311 and the second housing structure 312 come in contact with each other due to unfolding and folding of the electronic device 300.

As an embodiment, the hinge structure 313 may be covered or exposed through a portion of the first housing structure 311 and the second housing structure 312 according to a state (an unfolded state (flat state) or a folded state) of the electronic device 300. As an embodiment, when the electronic device 300 is in the unfolded state, the hinge structure 313 may be covered by the first housing structure 311 and the second housing structure 312. As an embodiment, when the electronic device 300 is in a folded state (for example, a fully folded state), the hinge structure 313 may be exposed to the outside between the first housing structure 311 and the second housing structure 312. As an embodiment, in the intermediate state in which the first housing structure 311 and the second housing structure 312 are folded with a certain angle, the hinge cover may be partially exposed to the outside between the first housing structure 311 and the second housing structure 312. In this case, the exposed area may be smaller than that of the fully folded state. As an embodiment, the hinge cover may include a curved surface.

The display 320 may be disposed in a space formed by the housing 310. For example, the display 320 may be seated in a recess formed by the housing 310 and form most of the front surface of the electronic device 300.

Accordingly, the front surface of the electronic device 300 may include the display 320, and a portion of the first housing structure 311 and a portion of the second housing structure 312 adjacent to the display 320. The rear surface of the electronic device 300 may include the first rear cover 380, a portion of the first housing structure 311 adjacent to the first rear cover 380, the second rear cover 390, and a portion of the second housing structure 312 adjacent to the second rear cover 390.

The display 320 may be referred to as a display having at least a partial area thereof transformable to a flat surface or a curved surface. As an embodiment, the display 320 may include a folding area 323, a first area 321 disposed at one side (for example, the left side in FIG. 3A) with reference to the folding area 323, and a second area 322 disposed at the other side (for example, the right side in FIG. 3A).

As an embodiment, the display 320 may include an organic light-emitting diode (OLED) display of top emission or bottom emission type. The OLED display may include a low temperature color filter (LTCF) layer, a window glass (for example, an ultra-thin glass (UTG) or polymer window), and an optical compensation film (for example, OCF). The LTCF layer of the OLED display may replace a polarizing film (or polarizing layer).

The division of areas of the display 320 is exemplary and the display 320 may be divided into multiple areas (for example, more than two) according to the structure or function thereof. As an embodiment, the area of the display 320 may be divided by the folding axis A or the folding area 323 extending in parallel with an y-axis, and in another embodiment, the area of the display 320 may be divided with reference to another folding area (for example, a folding area in parallel with an x-axis) or another folding axis (for example, a folding axis in parallel with an x-axis).

As an embodiment, the first area 321 and the second area 322 may have overall symmetrical shapes around the folding area 323.

Hereinafter, the operation of the first housing structure 311 and the second housing structure 312 and each area of the display 320 according to the state (for example, the unfolded state (flat state) and the folded state) of the electronic device 300 will be described.

As an embodiment, when the electronic device 300 is in the unfolded state (flat state) (for example, FIG. 3A), the first housing structure 311 and the second housing structure 312 may be arranged to form an angle of about 180 degrees therebetween and face substantially the same direction. The surface of the first area 321 and the surface of the second area 322 of the display 320 may form an angle of about 180 degrees therebetween and face substantially the same direction (for example, the front direction of electronic device). The folding area 323 may be in the same plane with the first area 321 and the second area 322.

As an embodiment, when the electronic device 300 is in the folded state (for example, FIG. 3B), the first housing structure 311 and the second housing structure 312 may be arranged to face each other. The surface of the first area 321 and the surface of the second area 322 of the display 320 may form a narrow angle (for example, between 0 degrees and about 10 degrees) therebetween and face each other. At least a portion of the folding area 323 may be formed to have a curved surface having a certain curvature.

As an embodiment, when the electronic device 300 is in the intermediate state, the first housing structure 311 and the second housing structure 312 may be arranged at a certain angle. The surface of the first area 321 and the surface of the second area 322 of the display 320 may form an angle therebetween larger than that of the folded state and smaller than that of the unfolded state. At least a portion of the folding area 323 may be formed of a curved surface having a certain curvature, and in this case, the curvature may be smaller than that of the folded state.

Figure 4:
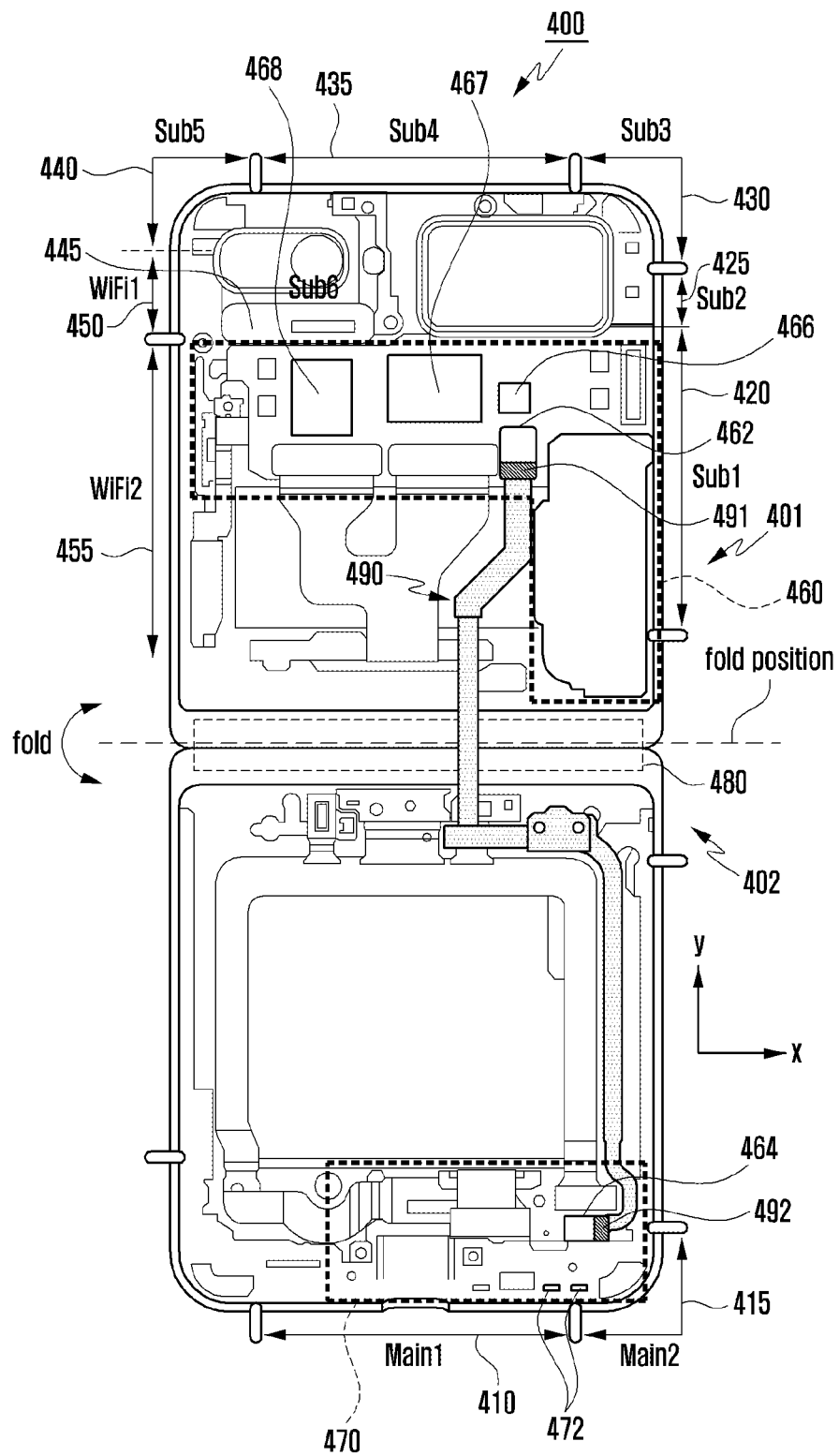
FIG. 4 is a view illustrating an example electronic device according to various embodiments of the disclosure.

FIG. 4 is a view illustrating an example electronic device 400 (for example, the electronic device 101 of FIG. 1) according to various embodiments of the disclosure.

Referring to FIG. 4, the electronic device 400 (for example, the electronic device 101 in FIG. 1) according to various embodiments of the disclosure may be a foldable device. The electronic device 400 may include a hinge structure 480 (for example, a hinge assembly) (for example, the hinge structure 313 in FIG. 3A and FIG. 3B) disposed in a fold position. For example, the electronic device 400 may be folded or unfolded in y-axis direction (for example, a vertical direction) with reference to the fold position (for example, x-axis) using the hinge structure 480.

As an embodiment, when the electronic device 400 is in the folded state, a first housing 401 and a second housing 402 may be adjacent to or come in contact with each other with reference to the fold position. In addition, when the electronic device 400 is in the unfolded state, the first housing 401 and the second housing 402 may be unfolded to be spaced apart from each other with reference to the fold position.

According to an embodiment, the electronic device 400 may include a first housing 401, a second housing 402, a first printed circuit board 460 disposed on the first housing 401, a second printed circuit board 470 disposed on the second housing 402, multiple antenna modules, and a flexible printed circuit board 490 (for example, a flexible printed circuit board type RF cable (FRC)). A modem 466, multiple front-end modules 467, and a transceiver 468 may be disposed on the first printed circuit board 460. An antenna power supplier 472 connected to at least one antenna module may be disposed on the second printed circuit board 470. The flexible printed circuit board 490 may connect the first printed circuit board 460 disposed on the first housing 401 and the second printed circuit board 470 disposed on the second housing 402.

As an embodiment, the multiple antenna modules may include a first antenna module 410 (a first main (Main 1) antenna module), a second antenna module 415 (a second main (Main 2) antenna module), a third antenna module 420 (Sub1 antenna module), a fourth antenna module 425 (for example, Sub2 antenna module), a fifth antenna module 430 (for example, Sub3 antenna module), a sixth antenna module 435 (for example, Sub4 antenna module), a seventh antenna module 440 (for example, Sub5 antenna module), an eighth antenna module 445 (for example, Sub6 antenna module), a first Wi-Fi (WiFi1) antenna module 450, and a second Wi-Fi (WiFi2) antenna module 455. According to an embodiment, the Wi-Fi modules include a Wi-Fi circuits for supporting Wi-Fi communication but is not limited thereto. For example, a Bluetooth circuit for supporting Bluetooth communication may be included.

As an embodiment, a first connector 491 of the flexible printed circuit board 490 may be electrically connected to a connector 462 of the first printed circuit board 460. The flexible printed circuit board 490 may be electrically connected to the first printed circuit board 460 through the first connector 491. A second connector 492 of the flexible printed circuit board 490 may be electrically connected to a connector 464 of the second printed circuit board 470. The flexible printed circuit board 490 may be electrically connected to the second printed circuit board 470 through the second connector 492. The flexible printed circuit board 490 may be folded or unfolded at the fold position of the electronic device 400. The transmission and reception of a display signal, control signal, and/or RF signal between the first printed circuit board 460 and the second printed circuit board 470 may be performed by the flexible printed circuit board 490.

The example electronic device 101, 300, and 400 according to various embodiments may include electronic devices such as a bar type, a foldable type, a rollable type, a sliding type, or a wearable type of electronic device, a tablet PC, and/or a notebook PC. The electronic device 101 and 300 according to various embodiments is not limited to the example described above and may include various other electronic devices.

Figure 5A:
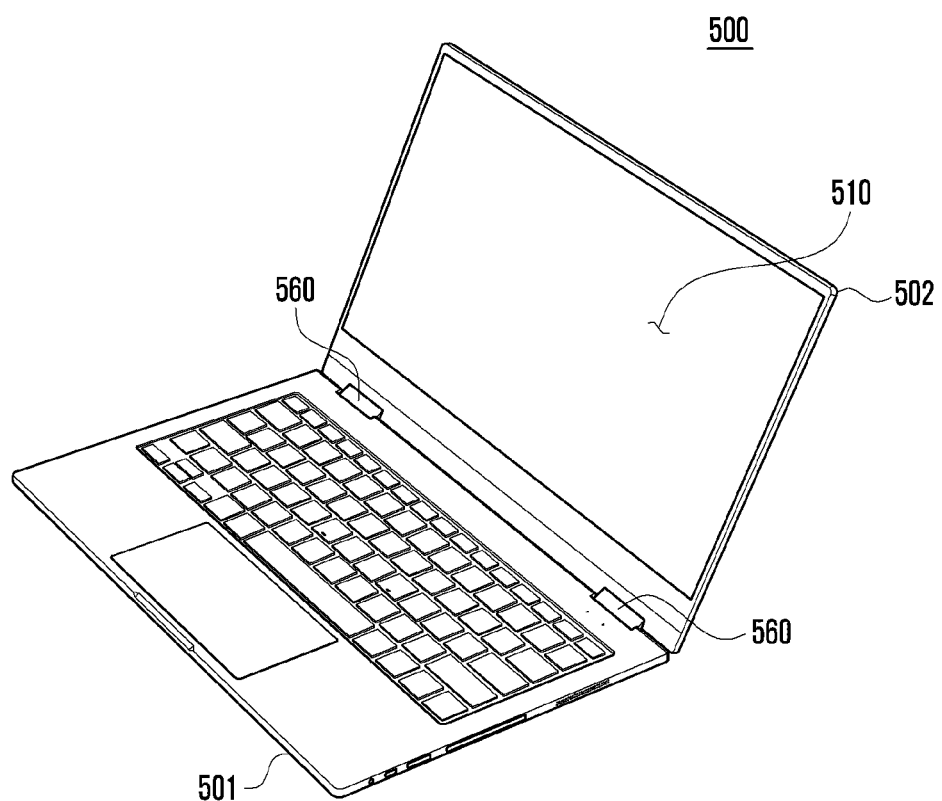
FIG. 5A and FIG. 5B are views illustrating an example electronic device according to various embodiments of the disclosure.
Figure 5B:
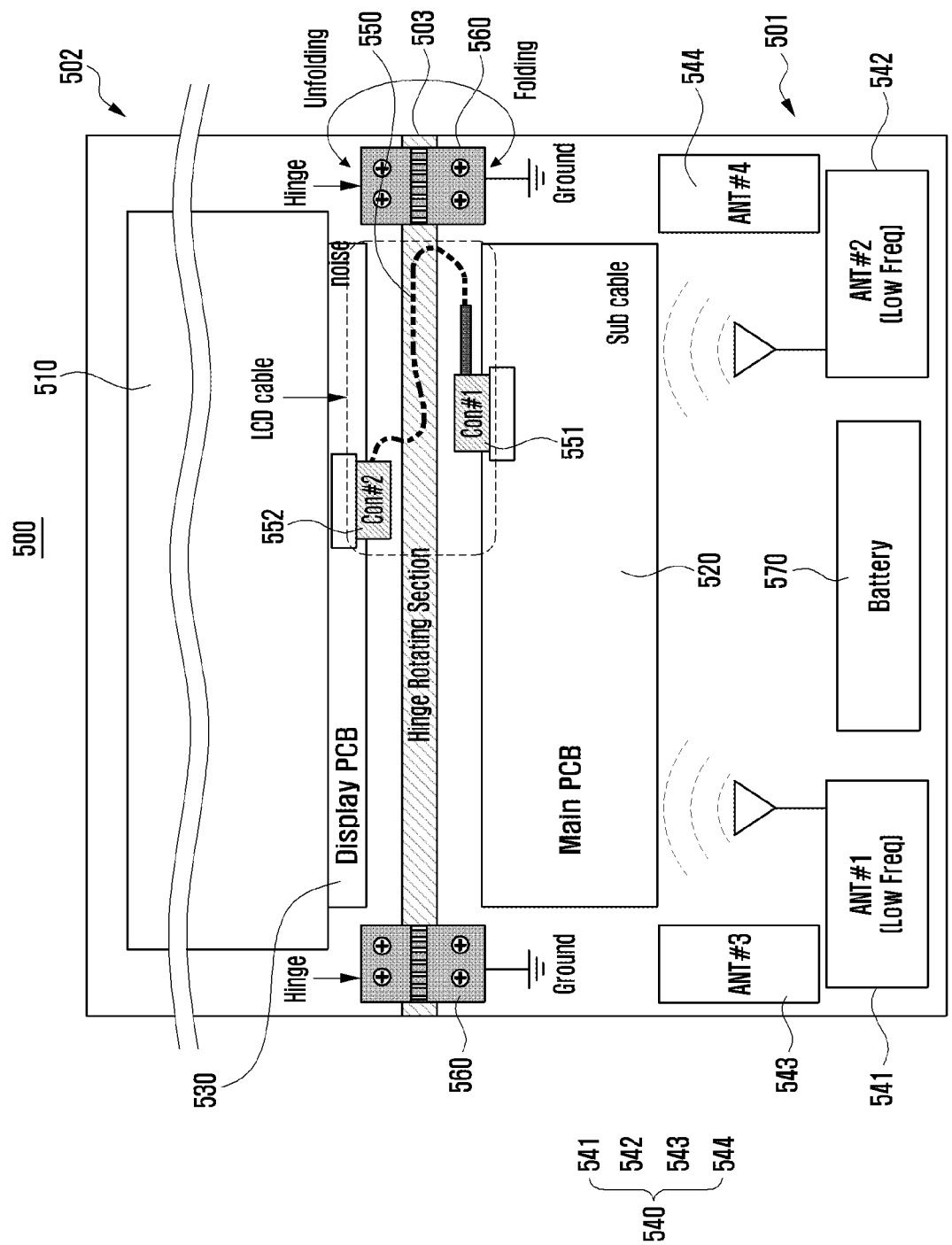

FIG. 5A and FIG. 5B are views illustrating an example electronic device according to various embodiments of the disclosure.

Referring to FIG. 5A and FIG. 5B, the electronic device 500 may include a first housing 501, a second housing 502, a hinge structure 560 (for example, a hinge assembly), and a battery 570. According to an embodiment, a first printed circuit board 520 (for example, a main PCB) may be disposed in a space formed by the first housing 501. The first printed circuit board 520 (for example, a main PCB) may have multiple electronic elements (for example, a processor, a communication module, a memory, a sensor module, an input device (for example, a keyboard and a touch pad), an interface, an audio module, a power management module, a battery, and an indicator) arranged thereon. The input device may be disposed to be visible to the outside.

According to an embodiment, a display 510 (for example, the display module 160 in FIG. 1), a second printed circuit board 530 (for example, a display PCB), and a camera module (for example, the camera module 180 in FIG. 1) may be arranged in a space formed by the second housing 502. The display 510 may be disposed to be visible to the outside. The second printed circuit board 530 (for example, a display PCB) may have a display driver IC (for example, the display driver IC 230 in FIG. 2) disposed thereon.

According to an embodiment, a microphone and a sensor device may be arranged in a space formed by the second housing 502. For example, a dual microphone may be disposed in a space formed by the second housing 502. For example, the sensor device may include a proximity sensor for identifying a user's position, a time of flight (TOF) sensor, and/or a Lidar sensor.

Figure 6:
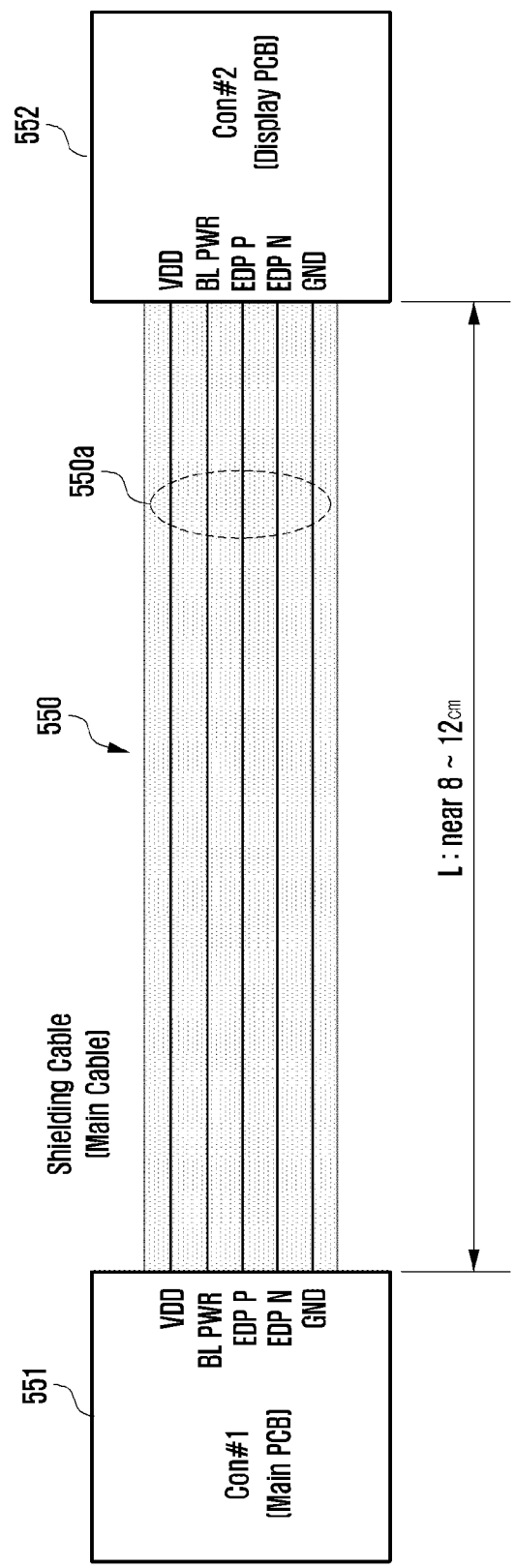
FIG. 6 is a view illustrating an example display cable shown in FIG. 5B.

FIG. 6 is a view illustrating a display cable shown in FIG. 5B.

Referring to FIG. 5B and FIG. 6, according to an embodiment, the electronic device 500 may include a cable structure 550 (for example, display cable) for electrically connecting the first printed circuit board 520 (for example, a main PCB) and the second printed circuit board 530 (for example, a display PCB). The cable structure 550 (for example, a display cable) may be electrically connected to the first printed circuit board 520 (for example, a main PCB) through the first connector 551. The cable structure 550 (for example, a display cable) may be electrically connected to the second printed circuit board 530 (for example, a main PCB) through the second connector 552. For example, the cable structure 550 (for example, a display cable) may include multiple wires 550a (for example, BL PWR, EDP P, and EDP N wires) for transferring a VDD power, ground, or display signal (for example, a camera image signal and microphone voice signal of an input device), and a control signal of a device. For example, the cable structure 550 (for example, a display cable) may include a flexible cable (for example, a coaxial cable or a flexible printed circuit board) so that the cable structure 550 (for example, a display cable) may be folded or unfolded in a hinge rotating section 503.

Referring to FIG. 5A and FIG. 5B again, according to an embodiment, the hinge structure 560 may include a hinge rotating section 503 and physically connect the first housing 501 and the second housing 502. For example, the hinge rotating section 503 may include a separate hinge cover. For example, in a case of a laptop PC, the hinge rotating section may be formed of a portion of the first housing 501 or the second housing 502. For example, the second housing 502 disposed on the upper part (for example, z-axis) of the first housing 501 may be folded or unfolded by the hinge structure 560. In addition, the first housing 501 and the lower part (for example, -z-axis) of the second housing 502 may be unfolded or folded to face each other by the hinge structure 560. For example, the first housing 501 and the second housing 502 may rotate by the hinge structure 560 so that the first housing 501 and the second housing 502 are unfolded or folded to face each other. For example, the first housing 501 may be fixed and the second housing 502 may rotate by the hinge structure 560 so that the first housing 501 and the second housing 502 are unfolded or folded to face each other. For example, the second housing 502 may be fixed and the first housing 501 may rotate by the hinge structure 560 so that the first housing 501 and the second housing 502 are unfolded or folded to face each other. For example, the hinge structure 560 may be electrically connected to a ground terminal of the first printed circuit board 520 (for example, a main PCB) and/or the second printed circuit board 530 (for example, a display PCB).

As an embodiment, the processor (for example, the processor 120 in FIG. 1) disposed on the first printed circuit board 520 may drive an operation system or an application program to control multiple hardware or software components. The processor may be implemented as a system on chip (SoC) and include a graphic processing unit (GPU) and/or an image signal processor.

As an embodiment, a memory may be disposed on at least one of the first printed circuit board 520 (for example, a main PCB) and the second printed circuit board 530. The memory disposed on at least one of the first printed circuit board 520 (for a main PCB) and the second printed circuit board 530 may include an internal memory or an external memory. The memory may include, for example, a transitory memory or a non-transitory memory. For example, the transitory memory may include a dynamic RAM (DRAM), a static RAM (SRAM), or a synchronous dynamic RAM (SDRAM). For example, the non-transitory memory may include a hard drive, a solid-state drive (SSD), a one-time programmable ROM (OTPROM), a programmable ROM (PROM), an erasable and programmable ROM (EPROM), an electrically erasable and programmable ROM (EEPROM), a mask ROM, a flash ROM, or a NAND flash memory.

As an embodiment, the processor may perform processing by loading a received command or data from the non-transitory memory into the transitory memory, and may store various data in the non-transitory memory.

According to various embodiments, the electronic device 500 may include multiple communication modules 540. The multiple communication modules 540 may include a first communication module 541 for communication in a low band frequency band and a second communication module 542 (for example, a radio frequency (RF) module). The multiple communication modules 540 may include a third communication module 543 (for example, a cellular module) for communication in a middle band and/or high band frequency band. The multiple communication modules 540 may include a fourth communication module 544 for Wi-Fi and Bluetooth communication. In addition, the multiple communication modules 540 may include a 5G communication module (for example, a higher frequency band communication module, and a giga band communication module), a global navigation satellite system (GNSS) module, and a near field communication (NFC) module.

As an embodiment, the input device may include a touch panel, a keyboard, a touch pad, a digitizer panel included in the display 510, and a digital pen (for example, a stylus pen) sensor.

As an embodiment, the interface may include a high-definition multimedia interface (HDMI), a universal serial bus (USB) interface, an optical interface, and/or a D-sub-miniature (D-sub). The interface may include a mobile high-definition link (MHL) interface, a secure digital (SD) card/multi-media card (MMC) interface, or an infrared data association (IrDA) standard interface.

Each of the above-described components of the electronic device 500 may be implemented as one or more parts and the name of a corresponding component may be different according to the types of electronic devices. In various embodiments, the electronic device may be implemented by including at least one of the above-described components and some components may be omitted or additional components may be further included.

Figure 7A:
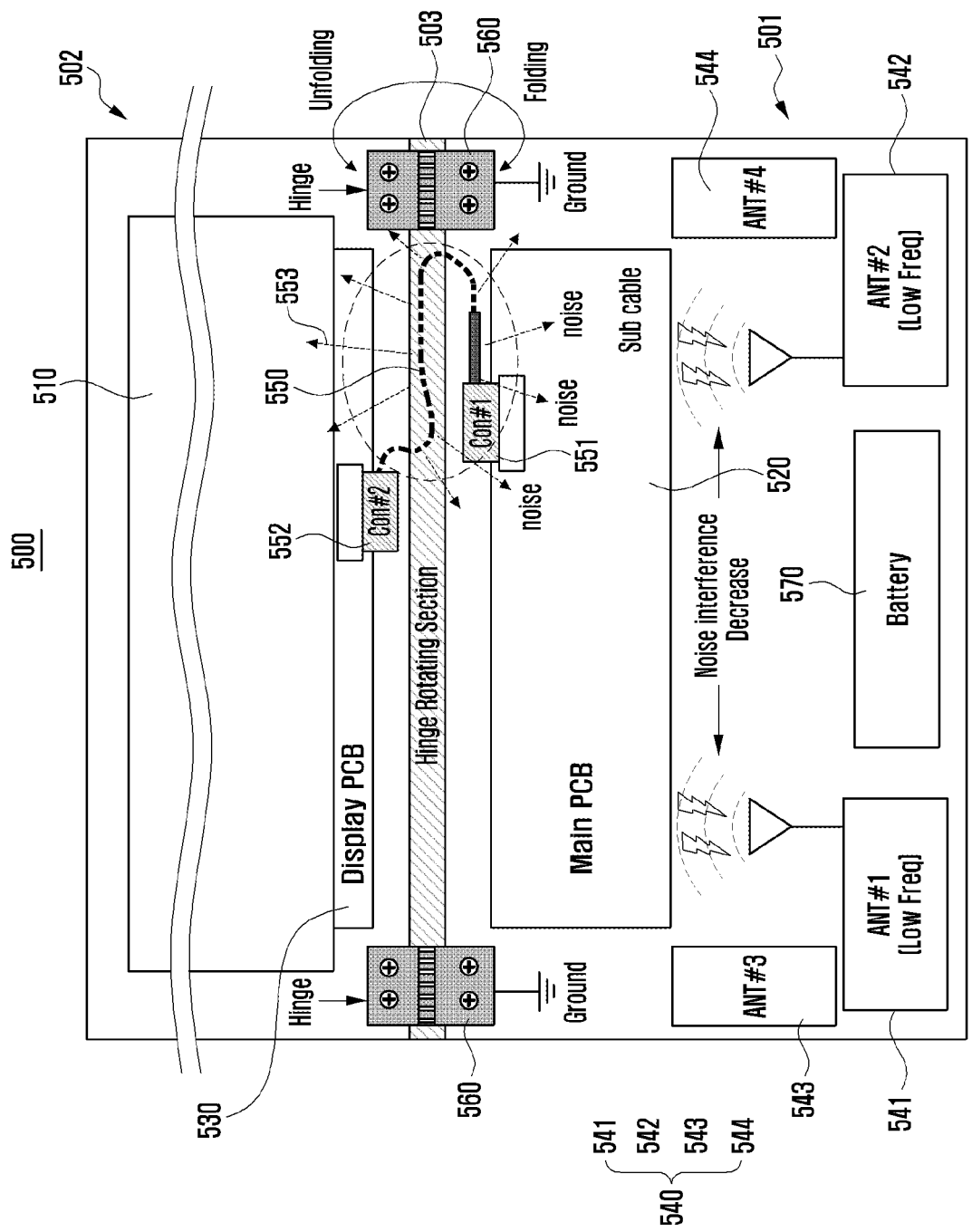
FIG. 7A is a view illustrating that radio frequency (RF) signal interference is incurred by noise.
Figure 7B:
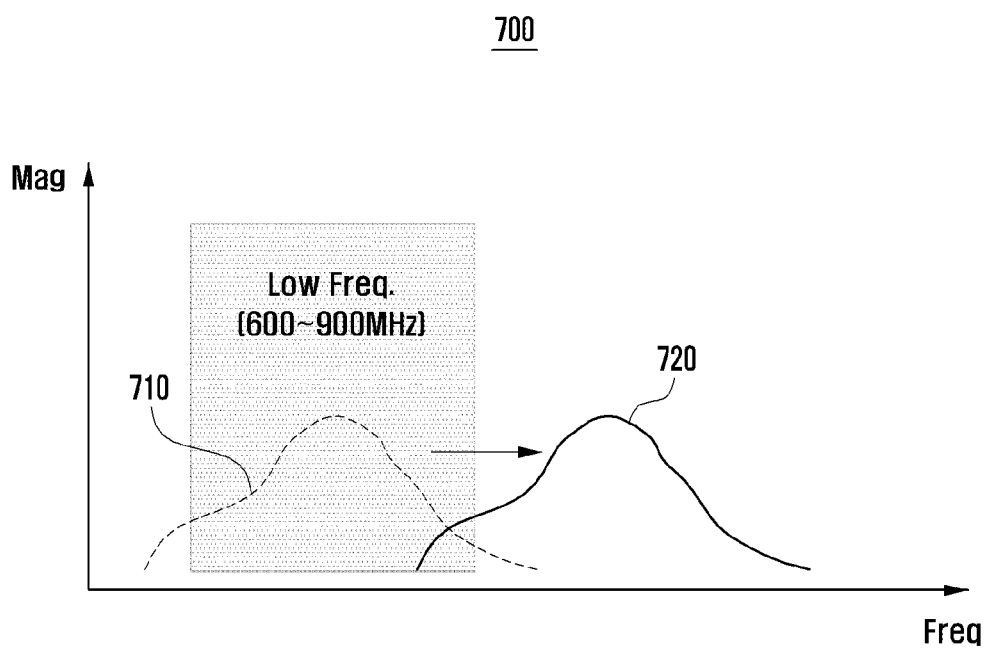
FIG. 7B is a view illustrating a parasitic resonance characteristic of an example display cable.

FIG. 7A is a view illustrating that radio frequency (RF) signal interference is incurred by noise. FIG. 7B is a view 700 illustrating a parasitic resonance characteristic of a display cable.

Referring to FIG. 7A and FIG. 7B, the cable structure 550 (for example, a display cable) of the electronic device 500 may have a length of about 8-12 cm and this may be similar to the theoretical length of a ¼ monopole antenna of 8.3-12.5 cm. When the display of the electronic device 500 is driven, a parasitic resonance 553 in an RF low-band frequency range 710 (600-900 MHz) may occur in the cable structure 550 (for example, a display cable). The parasitic resonance 553 in an RF low-band frequency may function as noise to degrade performance of the first communication module 541 and the second communication module 542 (for example, a radio frequency (RF) module).

In order to reduce or prevent the performance degradation of the first communication module 541 and the second communication module 542 (for example, a radio frequency (RF) module), the frequency band of the parasitic resonance occurring in the cable structure 550 (for example, a display cable) needs to be moved.

FIG. 8 is a view illustrating an example electronic device according to various embodiments of the disclosure.

Referring to FIG. 7B and FIG. 8, according to an embodiment, the electronic device 800 according to embodiments of the disclosure may reduce a ground path of the cable structure 850 (for example, a display cable) to move the frequency band of the parasitic resonance 853 occurring in the cable structure 850 (for example, a display cable) to an out band (for example, a frequency band not supported by the electronic device 800) (for example, 1,000-1,500 MHz indicated by 720 in FIG. 7B).

According to an embodiment, the electronic device 800 according to embodiments of the disclosure may move (for example, adjust an antenna length with respect to the coaxial cable) a ground branched point of the cable structure 850 (for example, a display cable) to move the frequency band of the parasitic resonance 853 occurring in the cable structure 850 (for example, a display cable) to an out band (for example, a frequency band not supported by the electronic device 800) (for example, 1,000-1,500 MHz indicated by 720 in FIG. 7B).

The frequency band of the parasitic resonance occurring in the cable structure 850 (for example, a display cable) may move to a frequency band not supported by the electronic device 800 so as to reduce or prevent performance degradation of the first communication module 841 and the second communication module 842 (for example, a radio frequency (RF) module).

The electronic device 800 according to various embodiments of the disclosure may include a first housing 801, a second housing 802, a hinge structure 860 (for example, a hinge assembly), and a battery 870. According to an embodiment, a first printed circuit board 820 (for example, a main PCB) may be disposed in a space formed by the first housing 801. The first printed circuit board 820 (for example, a main PCB) may have multiple electronic elements (for example, a processor, a communication module, a memory, a sensor module, an input device (for example, a keyboard), an interface, an audio module, a power management module, a battery, and an indicator) arranged thereon. The input device may be disposed to be visible to the outside. According to an embodiment, a display 810 (for example, the display module 160 in FIG. 1), a second printed circuit board 830 (for example, a display PCB), and a camera module (for example, the camera module 180 in FIG. 1) may be arranged in a space formed by the second housing 802. The display 810 may be disposed to be visible to the outside. The second printed circuit board 830 (for example, a display PCB) may have a display driver IC (for example, the display driver IC 230 in FIG. 2) disposed thereon.

According to an embodiment, the hinge structure 860 may physically connect the first housing 801 and the second housing 802. The second housing 802 disposed on the upper part (for example, z-axis in FIG. 5A) of the first housing 801 may be folded or unfolded by the hinge structure 860. In addition, the first housing 801 disposed on the lower part (for example, -z-axis in FIG. 5) of the second housing 802 may be folded or unfolded by the hinge structure 860. For example, the hinge structure 860 may be electrically connected to a ground terminal of the first printed circuit board 820 (for example, a main PCB) and/or the second printed circuit board 830 (for example, a display PCB).

According to various embodiments, the electronic device 800 may include multiple communication modules 840. The multiple communication modules 840 may include a first communication module 841 for communication in a low band frequency band and a second communication module 842 (for example, a radio frequency (RF) module). The multiple communication modules 840 may include a third communication module 843 (for example, a cellular module) for communication in a middle band and/or high band frequency band. The multiple communication modules 840 may include a fourth communication module 844 for Wi-Fi and Bluetooth communication. In addition, the multiple communication modules 840 may include a global navigation satellite system (GNSS) module and a near field communication (NFC) module.

Figure 9:
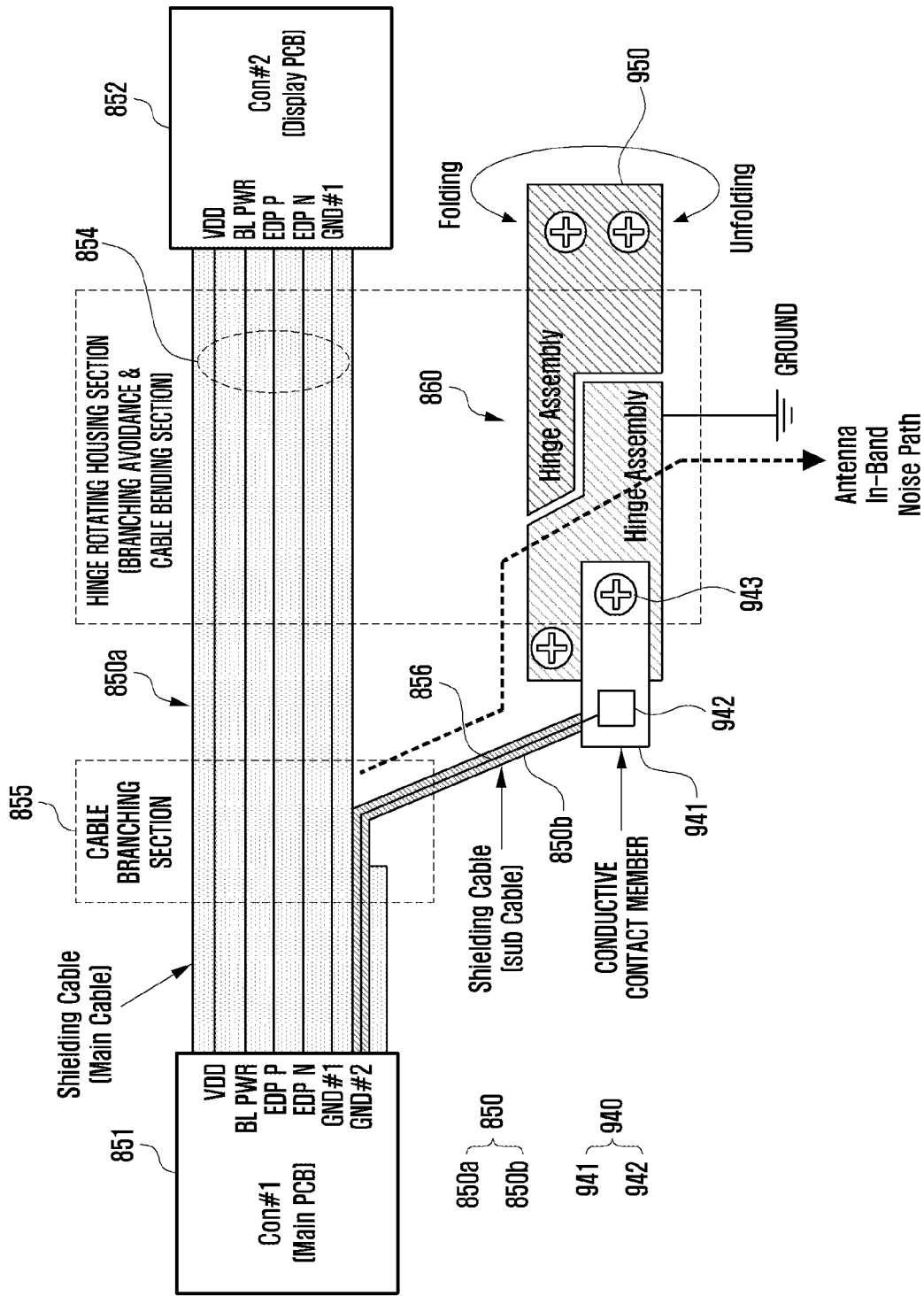
FIG. 9 is a view illustrating that an example cable structure (for example, a display cable) is grounded to a conductive member of a hinge structure (for example, a hinge assembly) according to various embodiments of the disclosure.
Figure 10:
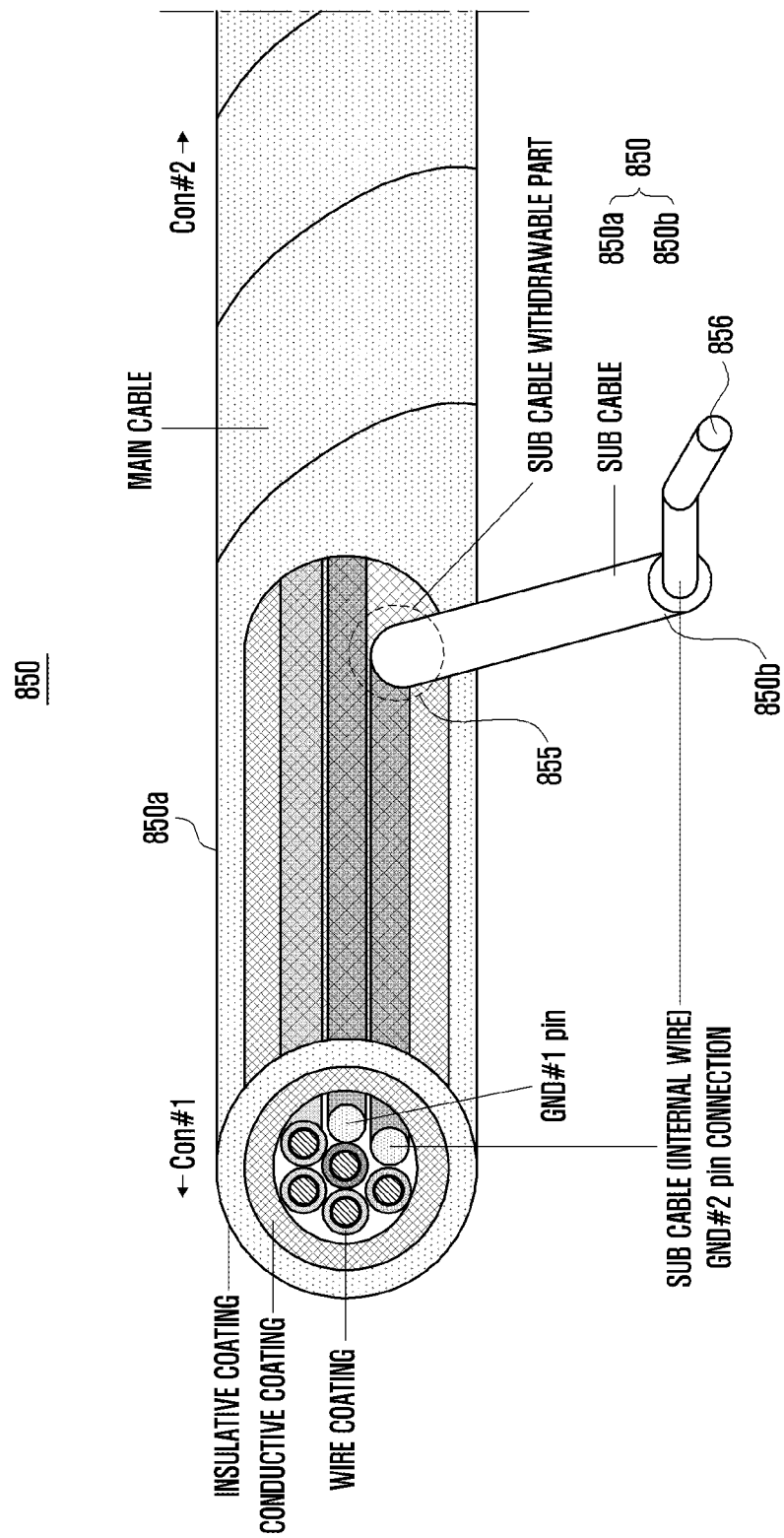
FIG. 10 is a view illustrating an example cable structure (for example, a display cable) according to various embodiments of the disclosure.

FIG. 9 is a view illustrating that an example cable structure (for example, a display cable) is grounded to a conductive member of a hinge structure (for example, a hinge assembly) according to various embodiments of the disclosure. FIG. 10 is a view illustrating an example cable structure (for example, a display cable) according to various embodiments of the disclosure.

Referring to FIG. 8, FIG. 9, and FIG. 10, the electronic device 800 may include a cable structure 850 (for example, a display cable) for electrically connecting the first printed circuit board 820 (for example, a main PCB) and the second printed circuit board 830 (for example, a display PCB). The cable structure 850 (for example, a display cable) may be electrically connected to the first printed circuit board 820 (for example, a main PCB) through the first connector 851. The cable structure 850 (for example, a display cable) may be electrically connected to the second printed circuit board 830 (for example, a main PCB) through the second connector 852.

As an embodiment, the cable structure 850 (for example, a display cable) may include an insulative coating, a conductive coating, and/or a wire coating.

As an embodiment, the cable structure 850 may include a first cable 850a (for example, a main cable and a display cable) for transferring a display signal and a second cable 850b (for example, a sub cable and a ground cable) for grounding to a ground. For example, the second cable 850b (for example, a sub cable and a ground cable) may be branched off from the first cable 850a (for example, a main cable and a display cable) at a cable branching section 855 forming a substantially straight line. For example, the cable structure 850 (for example, a display cable) may include a flexible cable (for example, a flexible printed circuit board) to be folded or unfolded in a hinge rotation section 803.

As an embodiment, the first printed circuit board 820 (for example, a main PCB) and the first connector 851 may be electrically connected. The second printed circuit board 830 (for example, a display PCB) and the second connector 852 may be electrically connected.

By way of example, the first cable 850a (for example, a main cable and a display cable) may include multiple wires 854 for transferring VDD power, a ground, a display signal, and a control signal. By way of example, the second cable 850b (for example, a sub cable and a ground cable) may include at least one ground wire 856 for grounding.

By way of example, a first side of a first ground wire of the first cable 850a (for example, a main cable and a display cable) may be electrically connected to a first ground terminal GND #1 of the first connector 851. A second side of a first ground wire of the first cable 850a (for example, a main cable and a display cable) may be electrically connected to a first ground terminal GND #1 of the second connector 852.

For example, a first side of a second ground wire of the second cable 850b (for example, a sub cable and a ground cable) may be electrically connected to a second ground terminal GND #2 of the first connector 851. A second side of a second ground wire of the second cable 850b (for example, a sub cable and a ground cable) may be electrically connected to a conductive contact member 940.

For example, the cable structure 850 (for example, a display cable) may include a flexible cable (for example, a flexible printed circuit board) such that the cable structure 850 (for example, a display cable) is folded or unfolded in a hinge rotation section 503. By way of example, the first ground terminals GND #1 of the first connector 851 and the second connector 852 may be electrically connected to the first cable 850a (for example, a main cable and a display cable).

As an embodiment, the first cable 850a (for example, a main cable and a display cable) and the second cable 850b (for example, a sub cable and a ground cable) may be formed as separate cables. For example, the first cable 850a (for example, a main cable and a display cable) and the second cable 850b (for example, a sub cable and a ground cable) may be formed as a shielding cable to be seen as one cable from the outside.

As an embodiment, the second ground terminal GND #2 of the first connector 851 may be electrically connected to at least one second ground wire 856 of the second cable 850b (for example, a sub cable and a ground cable). For example, the second ground wire 856 may be branched to be electrically connected to the conductive member 940 at a part adjacent to the first connector 851 among the first connector 851 and the second connector 852. For another example, the second ground wire 856 may be branched to be electrically connected to the conductive member 940 at a part adjacent to the second connector 852 among the first connector 851 and the second connector 852.

As an embodiment, the hinge structure 860 (for example, a hinge assembly) may include the conductive member 940 for grounding the second cable 850b (for example, a sub cable and a ground cable), and a hinge driving part 950 for physically connecting the first housing 801 and the second housing 802 such that the first housing 801 and the second housing 802 are folded/unfolded.

As an embodiment, the conductive member 940 may include a conductive sheet 941 and a solder pad 942. For example, the solder pad 942 may be electrically connected to the conductive sheet 941 and at least one ground wire 856 of the second cable 850b (for example, a sub cable and a ground cable) may be electrically connected to the solder pad 942.

As an embodiment, the conductive member 940 may be electrically connected and coupled to the hinge driving part 950 by a fastening member 943 (for example, a screw).

Figure 11A:
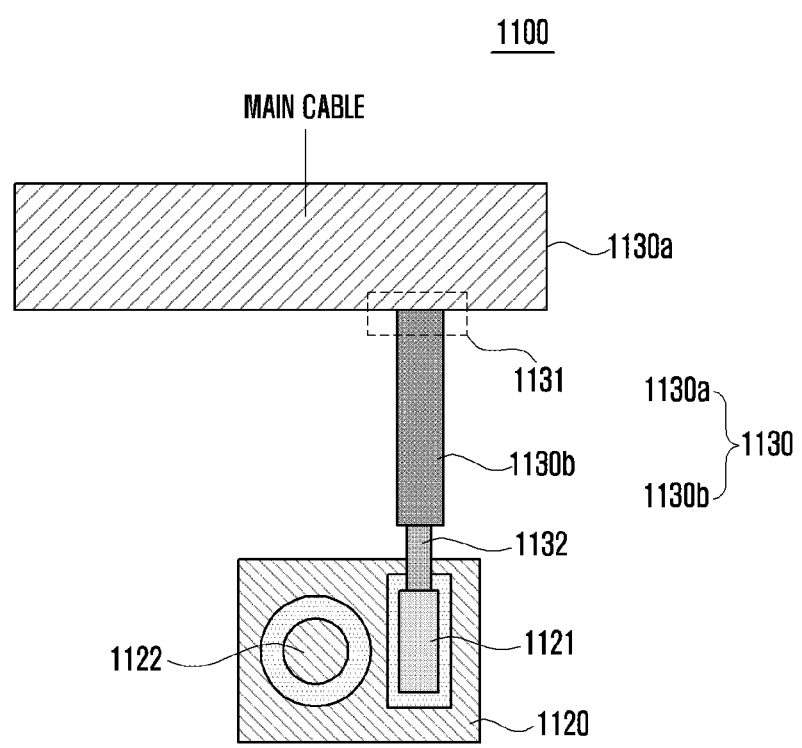
FIGS. 11A, 11B, and 11C are views illustrating an example structure in which cable structure (for example, a display cable) is grounded to a conductive member of a hinge structure (for example, a hinge assembly) according to various embodiments of the disclosure.
Figure 11B:
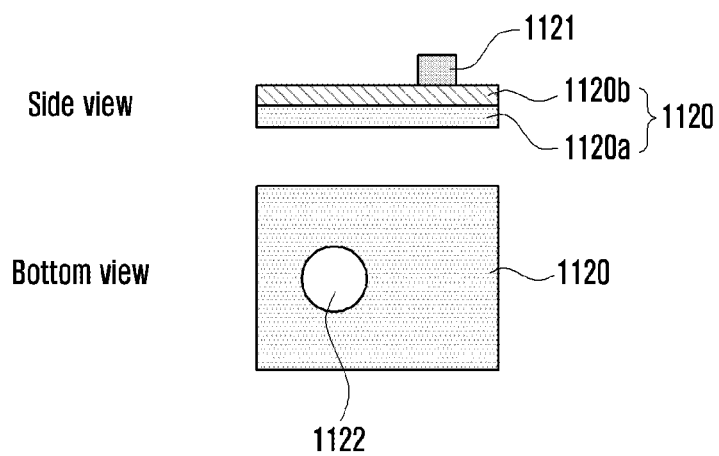
Figure 11C:
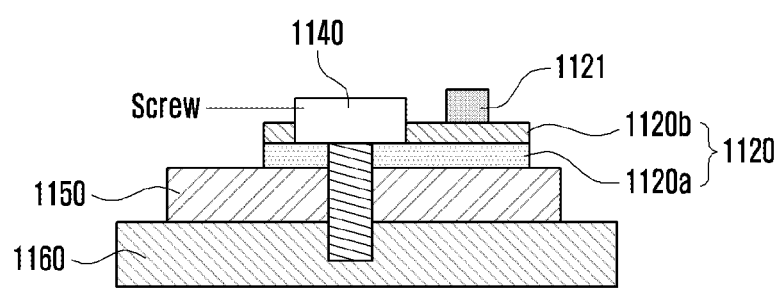

FIGS. 11A, 11B, and 11C are views 1100 illustrating an example structure 1100 in which cable structure (for example, a display cable) is grounded to a conductive member of a hinge structure (for example, a hinge assembly) according to various embodiments of the disclosure.

Referring to FIG. 8 and FIGS. 11A, 11B, and 11C, a cable structure 1130 (for example, the cable structure 850 in FIG. 8 and FIG. 10) may include a first cable 1130a (for example, a main cable and a display cable) (for example, the first cable 850a in FIG. 8 and FIG. 10) and a second cable 1130b (for example, a sub cable and a ground cable) (for example, the second cable 850b in FIG. 8 and FIG. 10). For example, the second cable 1130b (for example, a sub cable and a ground cable) may be branched off from the first cable 1130a (for example, a main cable and a display cable) at a cable branching section 1131 (for example, the cable branching section 855 in FIG. 9 and FIG. 10) forming a substantially straight line.

As an embodiment, the conductive member 1120 may include a conductive sheet 1120a, a cover layer 1120b, and a solder pad 1121. At least one ground wire 1132 of the second cable 1130b (for example, a sub cable and a ground cable) may be electrically connected to the solder pad 1121 of the conductive member 1120.

As an embodiment, the conductive member 1120 may be formed of a jack type, a terminator, an adapter, or a coupling member.

As an embodiment, without the conductive member 1120, at least one ground wire 1132 of the second cable 1130b (for example, a sub cable and a ground cable) may be electrically connected to a ground terminal of the first printed circuit board (for example, the first printed circuit board 820 in FIG. 8) (for example, a main PCB).

As an embodiment, without the conductive member 1120, at least one ground wire 1132 of the second cable 1130b (for example, a sub cable and a ground cable) may be electrically connected to a ground terminal of the second printed circuit board (for example, the second printed circuit board 830 in FIG. 8) (for example, a display PCB).

As an embodiment, the conductive member 1120 may be disposed on the hinge driving part 1150 (for example, the hinge driving part 950 in FIG. 9) and the conductive member 1120 and the hinge driving part 1150 may be electrically connected to each other. For example, the conductive member 1120 may have a hole 1122 formed therein and the conductive member 1120 and the hinge driving part 1150 may be electrically connected and coupled to each other by inserting a fastening member 1140 (for example, the fastening member 943 in FIG. 9) into the hole 1122. For example, a metallic housing 1160 (for example, the first housing 801 and the second housing 802 in FIG. 8) may be disposed under the hinge driving part 1150, and the hinge driving part 1150 and the metallic housing 1160 may be electrically connected and couple to each other by the fastening member 1140.

For example, the hinge structure (for example, the hinge structure 860 in FIG. 8 and FIG. 9) may be electrically connected to a ground terminal of the first printed circuit board (for example, the first printed circuit board 820 in FIG. 8) (for example, a main PCB) and/or the second printed circuit board (for example, the second printed circuit board 830 in FIG. 8) (for example, a display PCB). As such, the second cable 1130b (for example, a sub cable and a ground cable) of the cable structure 1130 (for example, the cable structure 850 in FIG. 8 and FIG. 10) may be grounded to the hinge structure (for example, the hinge structure 860 in FIG. 8 and FIG. 9).

Figure 12:
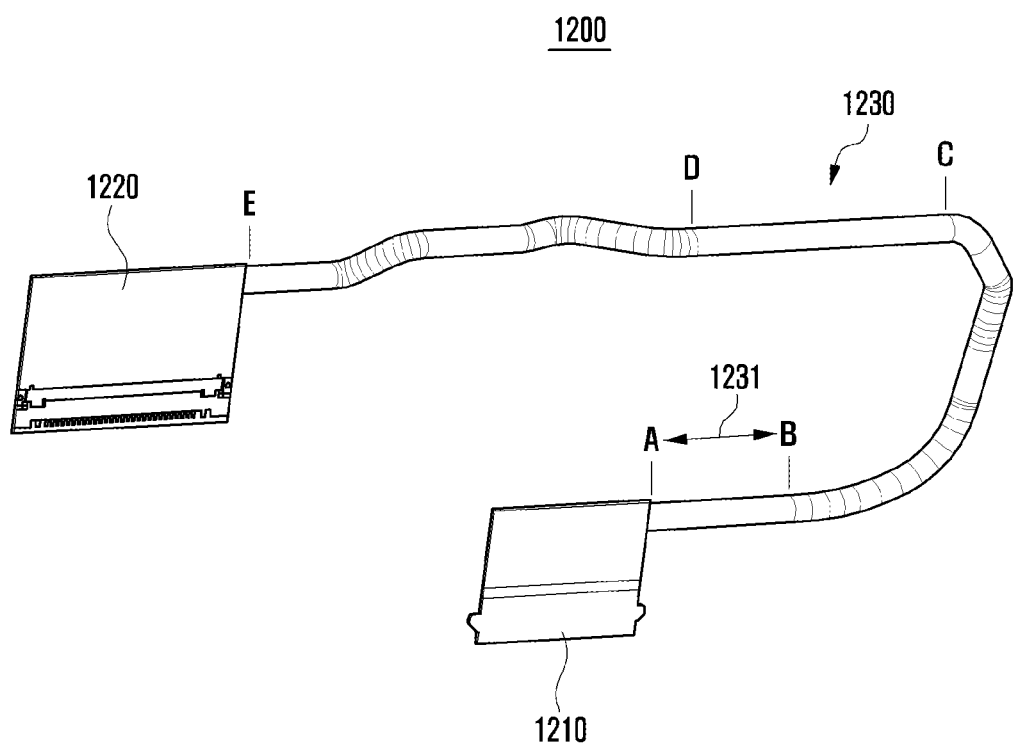
FIG. 12 is a view illustrating a position at which a second cable (for example, a sub cable) is branched from a first cable (for example, a main cable) of a cable structure (for example, a display cable).
Figure 13:
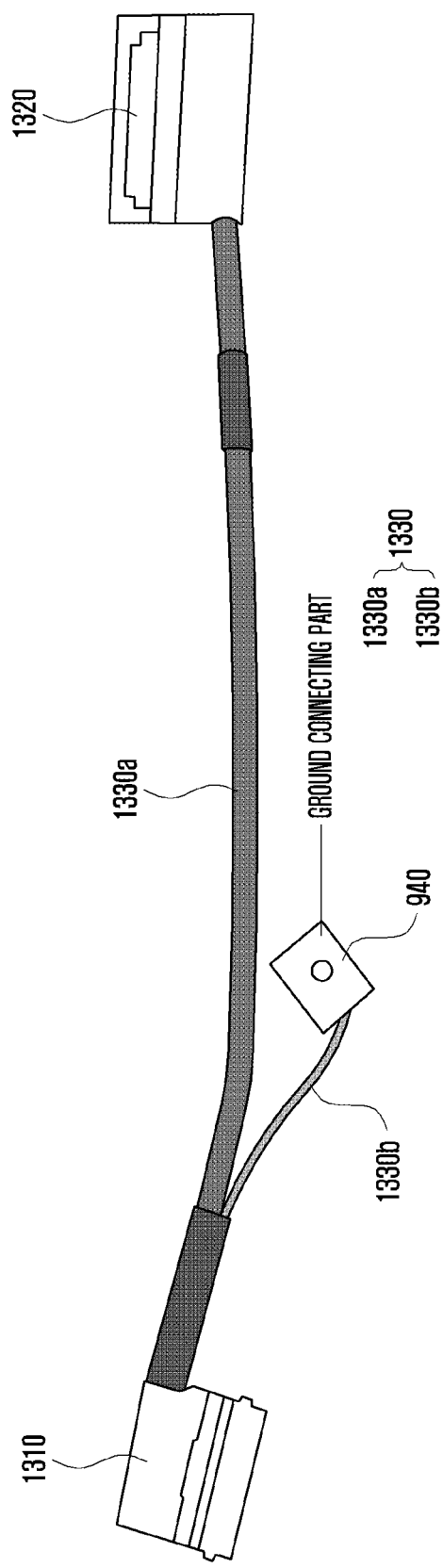
FIG. 13 is a view illustrating an example cable structure (for example, a display cable) according to various embodiments of the disclosure.

FIG. 12 is a view 1200 illustrating a position at which a second cable (for example, a sub cable) is branched from a first cable (for example, a main cable) of a cable structure (for example, a display cable). FIG. 13 is a view illustrating an example cable structure (for example, a display cable) according to various embodiments of the disclosure.

Referring to FIG. 12 and FIG. 13, a first side of a display cable 1230 may be electrically connected to a first connector 1210 of a first printed circuit board (for example, the first printed circuit board 820 in FIG. 8). A second side of the display cable 1230 may be electrically connected to a second connector 1220 of a second printed circuit board (for example, the second printed circuit board 830 in FIG. 8). A first housing (for example, the first housing 801 in FIG. 8)

and a second housing (for example, the second housing 802 in FIG. 9) are folded/unfolded by a hinge structure (for example, the hinge structure 860 in FIG. 8 and FIG. 9) and thus a partial section of the display cable 1230 may have flexibility and exist in a bent form.

As an embodiment, when the entirety of the display cable 1230 is divided into multiple sections (A-E), a straight section 1231 having a predetermined length from the first connector 1210 may exist. B-C sections and D-E sections which are remaining sections other than the straight section 1231 may be cable bending and flexible sections. In addition, C-D sections correspond to a hinge rotation section (for example, the hinge rotation section 803 in FIG. 8) and thus may have small spaces and go through repeated foldings and unfoldings. Therefore, in various embodiments, among the entire sections of the cable structure 1330, the straight 1231 section is the section for the second cable 1330b to be branched from the first cable 1330a.

Figure 14:
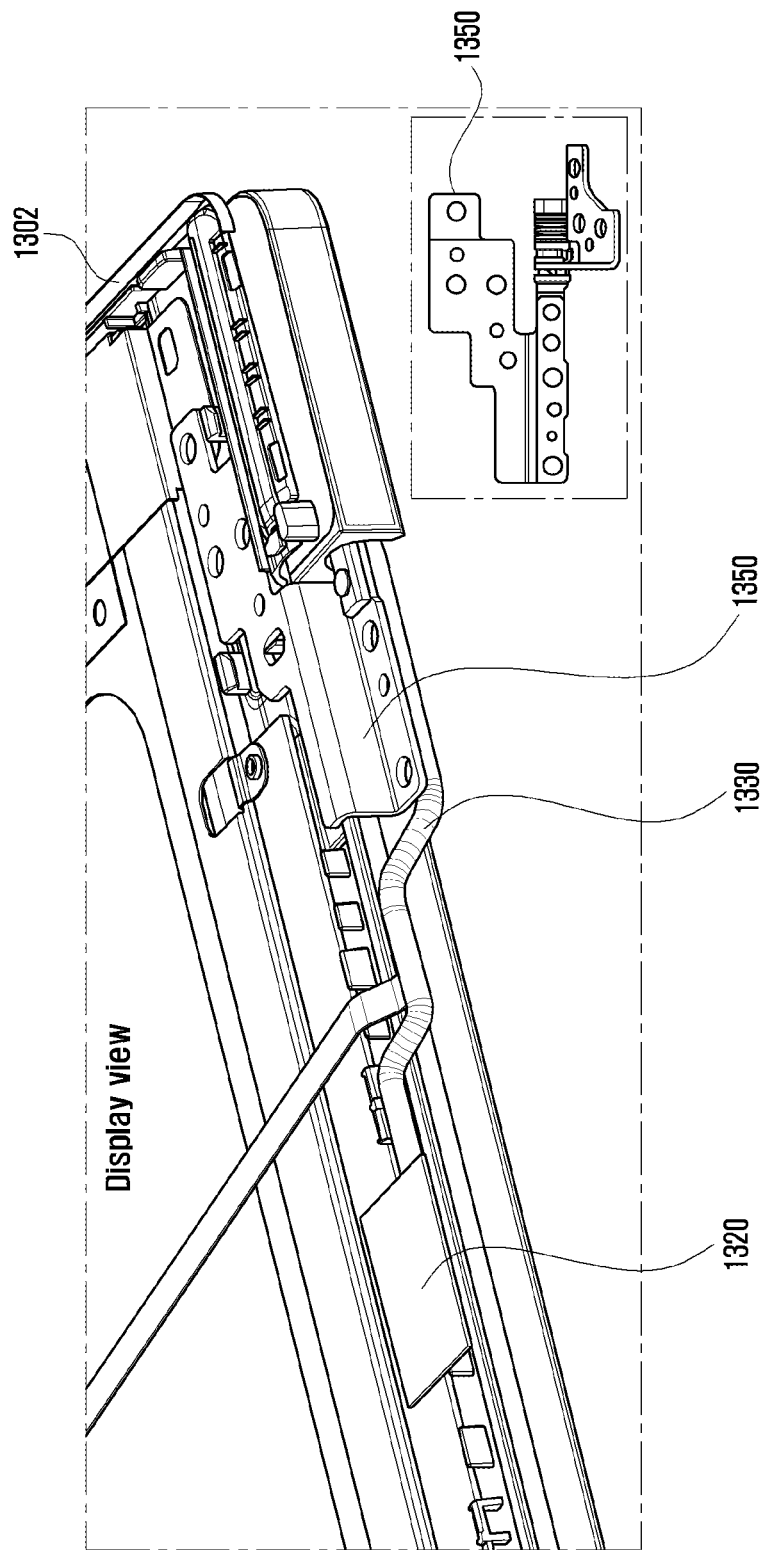
FIG. 14 is a view illustrating an example arrangement structure of a cable structure (for example, a display cable) in a second housing.
Figure 15:
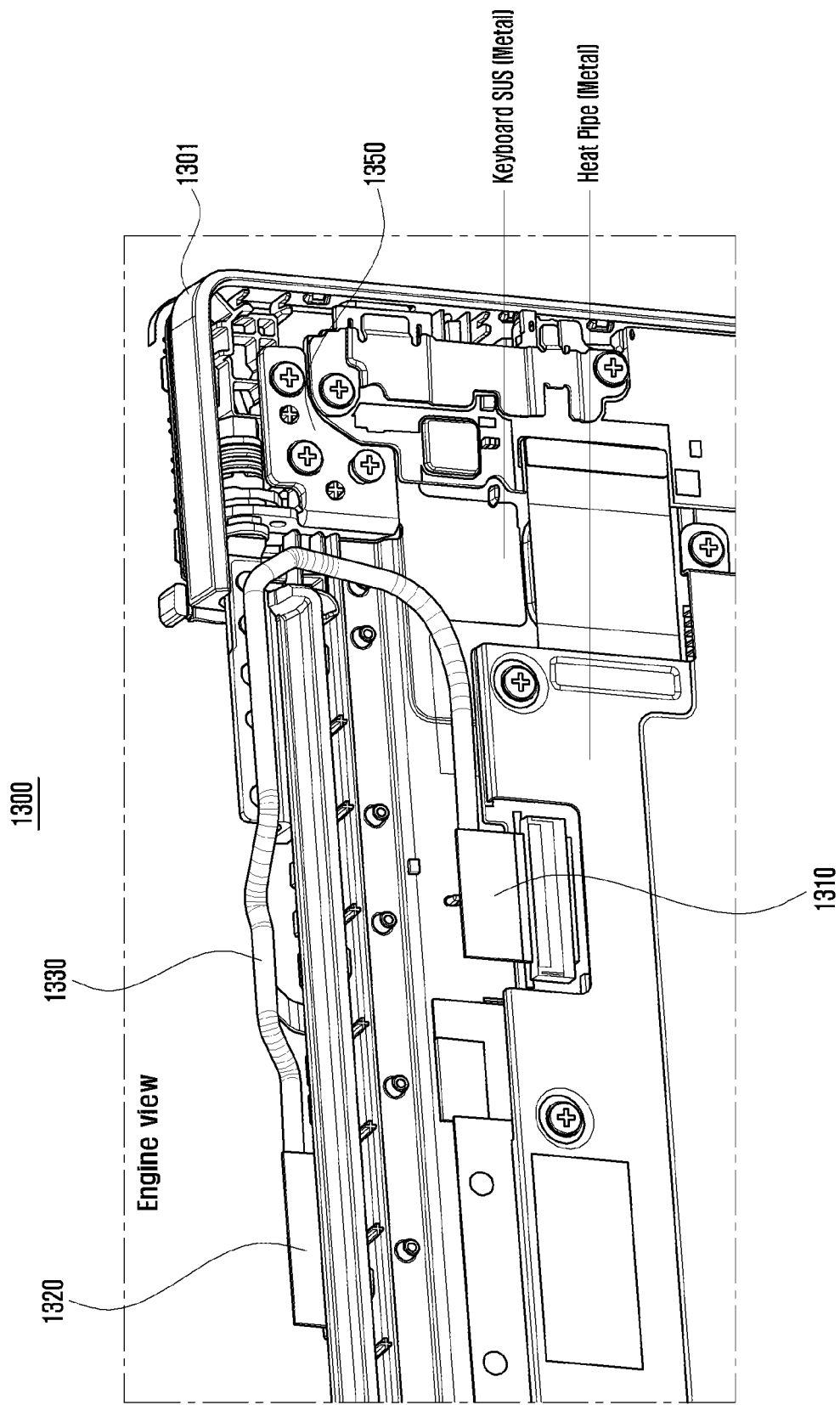
FIG. 15 is a view illustrating an example arrangement structure of a cable structure (for example, a display cable) in a first housing.

FIG. 14 is a view illustrating an example arrangement structure of a cable structure (for example, a display cable) in a second housing. FIG. 15 is a view illustrating an example arrangement structure of a cable structure (for example, a display cable) in a first housing.

Referring to FIG. 13, FIG. 14, and FIG. 15, a first side of the cable structure 1330 may be electrically connected to the first connector 1310 disposed on the first housing 1301, and a second side of the cable structure 1330 may be electrically connected to the second connector 1320 disposed on the second housing 1302. The second cable 1330b of the cable structure 1330 may be electrically connected to a conductive member (for example, the conductive member 940 in FIG. 9 and the conductive member 940 in FIG. 13) of the hinge structure 1350 (for example, the hinge structure 860 in FIG. 9). Through this, the cable structure 1330 may be grounded to a ground of the hinge structure 1350 (for example, the hinge structure 860 in FIG. 9).

Figure 16:
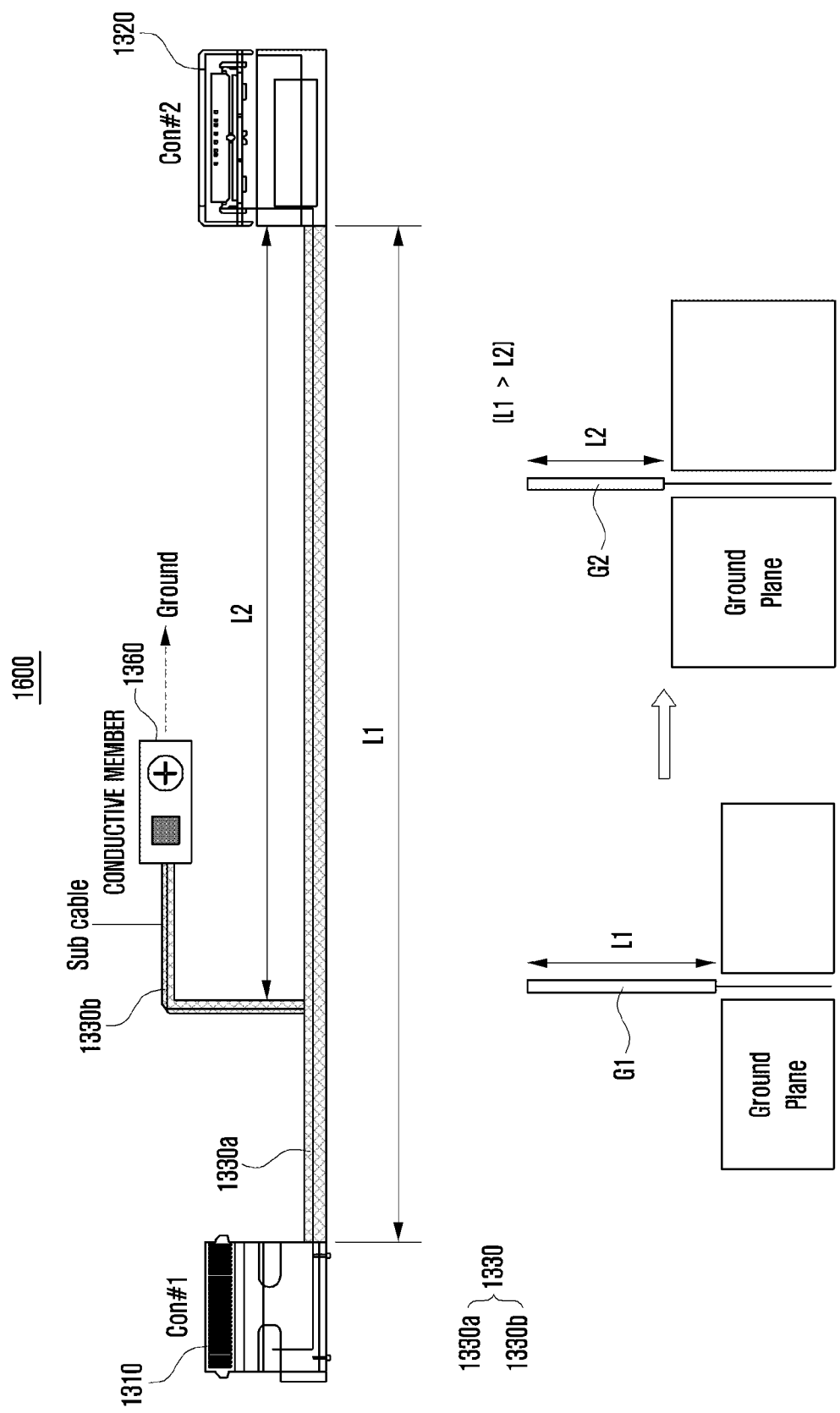
FIG. 16 is a view illustrating that a ground path is shortened by an example cable structure (for example, a display cable) according to various embodiments of the disclosure.
Figure 17:
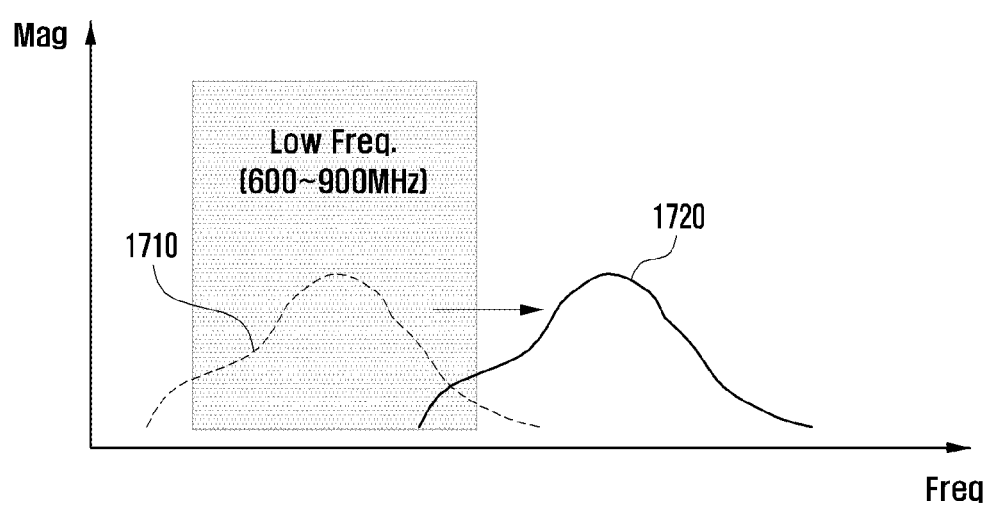
FIG. 17 is a view illustrating a parasitic resonance characteristic of an example cable structure (for example, a display cable).

FIG. 16 is a view 1600 illustrating that a ground path is shortened by means of application of an example cable structure (for example, a display cable) according to various embodiments of the disclosure. FIG. 17 illustrates a parasitic resonance characteristic of an example cable structure (for example, a display cable).

Referring to FIG. 16 and FIG. 17, the second cable 1330b may be branched off from the first cable 1330a of the cable structure 1330. The second cable 1330b may be electrically connected to a conductive member 1360 (for example, the conductive member 940 in FIG. 9 and the conductive member 940 in FIG. 13) of the hinge structure (for example, the hinge structure 860 in FIG. 9).

As an embodiment, when the second cable 1330b is electrically connected to the conductive member 1360 (for example, the conductive member 940 in FIG. 9 and the conductive member 940 in FIG. 13) of the hinge structure (for example, the hinge structure 860 in FIG. 9), a ground path G1 and G2 may change. By way of example, the ground path may be shortened when a second ground path G2 is formed by a length L2 to a point in which the second cable 1330b is connected to the conductive member 1360 (for example, after grounding: L2=c/f2 (L1>L2, f1<f2) (c=light speed, and f=frequency)) compared to a case in which a first ground path G1 is formed by the entire length L1 of the cable structure 1330 (for example, before grounding: L1=c/f1, (c=light speed, and f=frequency)). As the ground path of the cable structure 1330 is shortened, a frequency band of parasitic resonance occurring in an RF low-band frequency band 1710 (for example, 600-900 MHz) may move to a high frequency band 1720 (for example, 1,000-1,500 MHz) which is a frequency band not supported by the electronic device. For example, the frequency band of parasitic resonance may move to avoid various frequency bands formed by driving of the electronic device.

Figure 18:
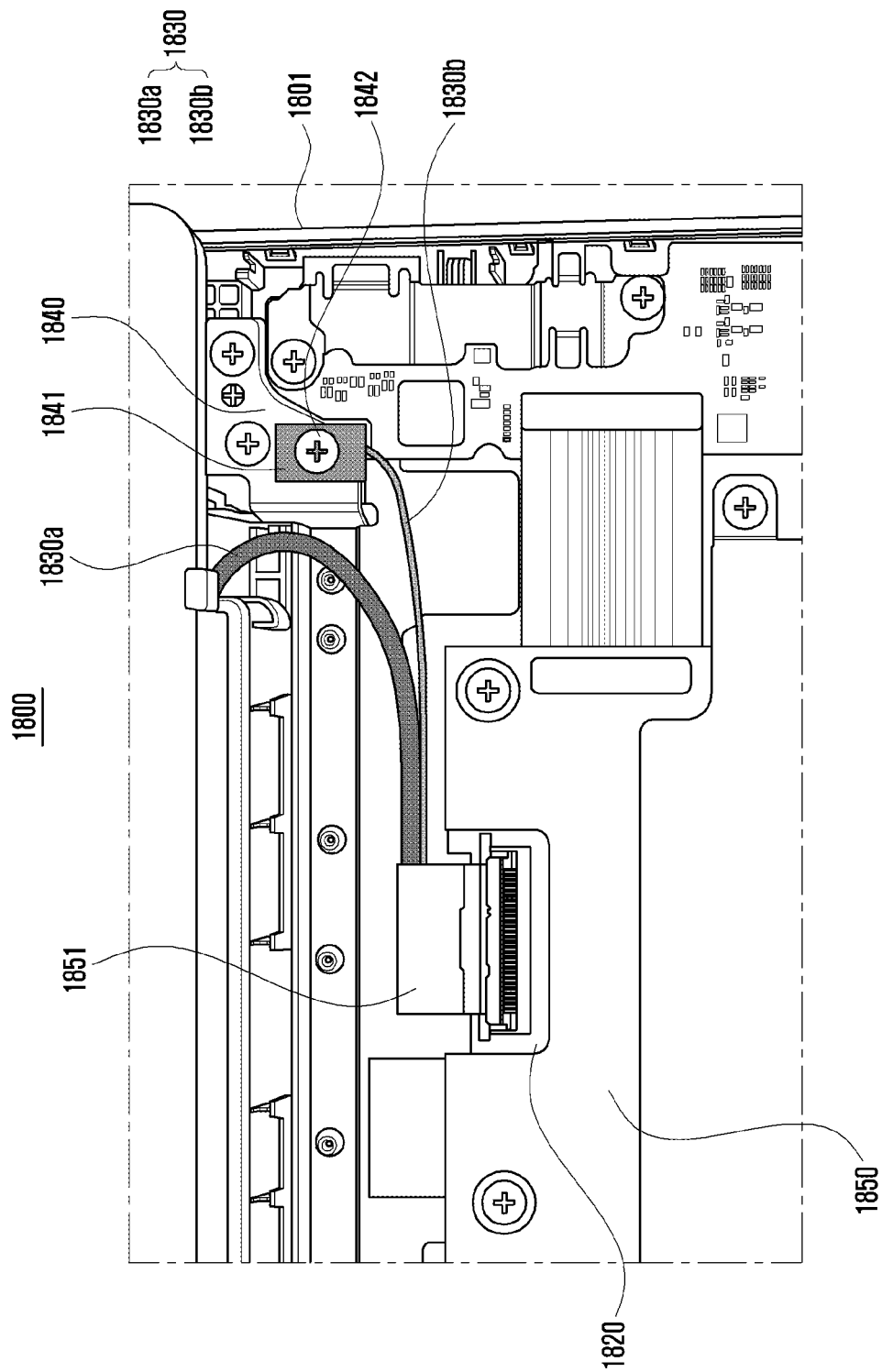
FIG. 18 and FIG. 19 are views illustrating that radio frequency (RF) signal interference caused by noise is reduced.
Figure 19:
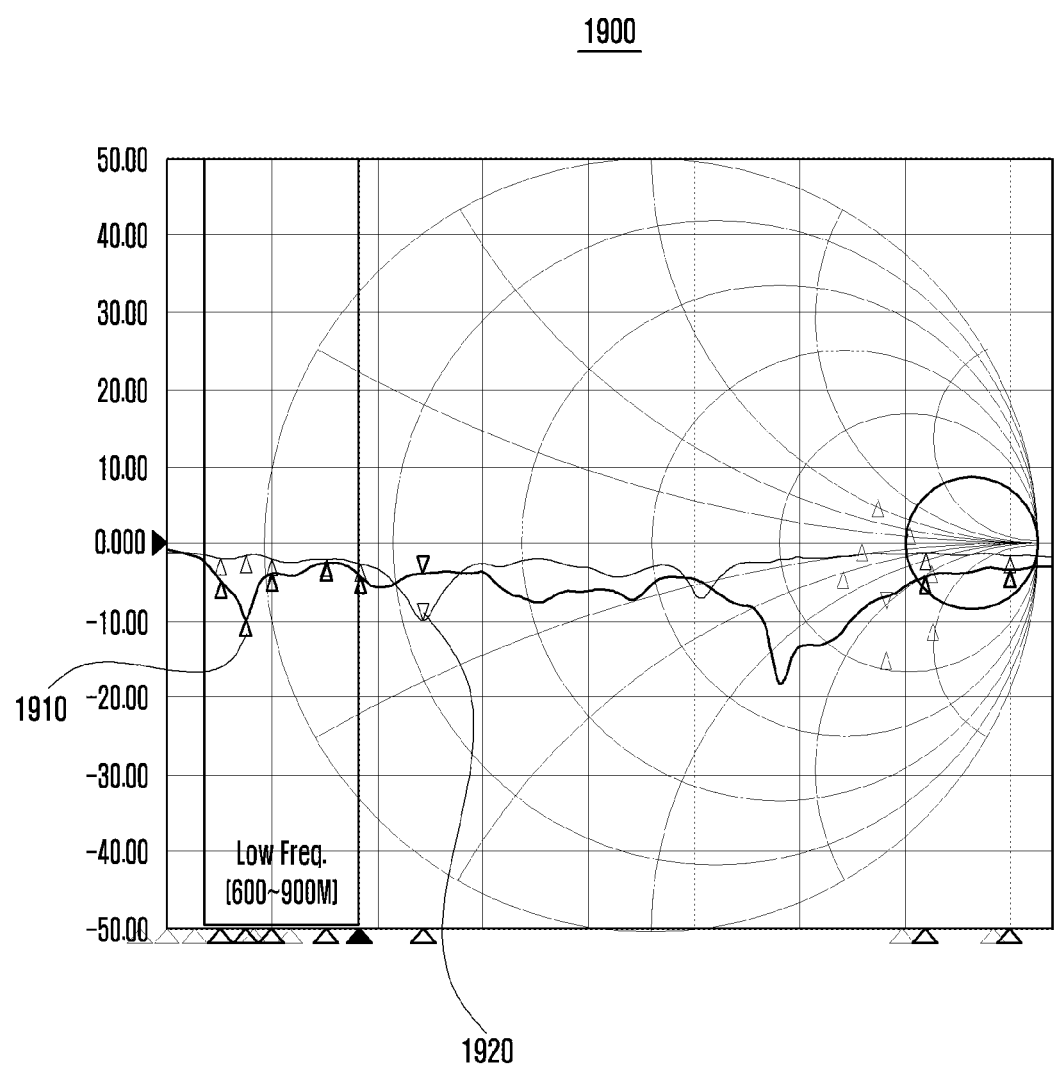

FIG. 18 and FIG. 19 are views illustrating that radio frequency (RF) signal interference caused by noise is reduced.

Referring to FIG. 18 and FIG. 19, an electronic device 1800 (for example, the electronic device 800 in FIG. 8) according to various embodiments of the disclosure may include a first housing 1801, a second housing (for example, the second housing 802 in FIG. 8), a first printed circuit board 1820 disposed in the first housing 1801, a second printed circuit board (for example, the second printed circuit board 830 in FIG. 8) disposed in the second housing (for example, the second housing 802 in FIG. 8), a hinge structure (for example, the hinge structure 860 in FIG. 8), and a cable structure 1830 (for example, the cable structure 850 in FIG. 8). For example, a heat dissipation member 1850 for dissipating heat may be disposed on the first printed circuit board 1820.

As an embodiment, a first side of the cable structure 1830 (for example, the cable structure 1330 in FIG. 16) may be electrically connected to a first connector 1851 of the first printed circuit board 1820 disposed in the first housing 1801. A second side of the cable structure 1830 (for example, the cable structure 1330 in FIG. 16) may be electrically connected to a second connector (for example, the second connector 852 in FIG. 8) disposed in the second housing (for example, the second housing 802 in FIG. 8). For example, the conductive member 1840 may be electrically connected and coupled to the hinge structure 860 by a fastening member 1842. A second cable 1830b branched off from a first cable 1830a of the cable structure 1830 (for example, the cable structure 1330 in FIG. 16) may be electrically connected to the conductive member 940 of the hinge structure 860 and thus the cable structure 1830 may be grounded to the hinge structure 860.

When the display cable of a comparative example is applied to the electronic device, parasitic resonance 1910 occurs in an RF low-band frequency band (for example, 600-900 MHz) and thus RF performance of a first communication module (for example, the first communication module 841 in FIG. 8) and a second communication module (for example, the second communication module 842 in FIG. 8) may be degraded.

On the other hand, when the cable structure (for example, the cable structure 1330 in FIG. 16) according to various embodiments of the disclosure is applied, a frequency band of parasitic resonance 1920 may move to an out band (for example, 1,000-1,500 MHz).

Referring Table 1 and Table 2 below, it is shown that in frequency band B71, frequency band B12, frequency band B13, frequency band B5, and/or frequency band B8, high frequency band It can be seen that the passive gain is improved. Accordingly, it can be confirmed that the RF performance of the first communication module (for example, the first communication module 841 in FIG. 8) and the second communication module (for example, the second communication module 842 in FIG. 8) is improved by the frequency band of the parasitic resonance 1920 moving to an out band.

TABLE 1

| Band | B71 | near B71, B12 | B13 | B5 | B8 high | Out Band |
|---|---|---|---|---|---|---|
| Freq (MHz) | 630 | 690 | 750 | 880 | 960 | 1110 |
| Before grounding (L1) | −5 | −9.7 | −3.7 | −2.6 | −4.2 | −3.8 |
| Before grounding (L2) | −1.9 | −1.7 | −2.1 | −2.1 | −2.6 | −9.9 |
| Delta | passive gain 3.1 | passive gain 8 | passive gain 1.6 | passive gain 0.5 | passive gain 1.6 | passive gain −6.1 |

TABLE 2

| Band | B71 | B12 | B13 | B14 | B5 |
|---|---|---|---|---|---|
| LCD off | 97.6 | 100.5 | 97 | 97.3 | 97.6 |
| LCD on Before grounding (L1) | 91.7 | 96.3 | 94.1 | 92 | 95.6 |
| | −5.9 | −4.2 | −2.9 | −5.3 | −2 |
| LCD on After grounding (L2) | 93.8 | 97.5 | 94.8 | 93.9 | 96.1 |
| | −3.8 | −3 | −2.2 | −3.4 | −1.5 |
| Improvement | passive gain 3.1 | passive gain 8 | passive gain 1.6 | passive gain 0.5 | passive gain 1.6 |

Figure 20:
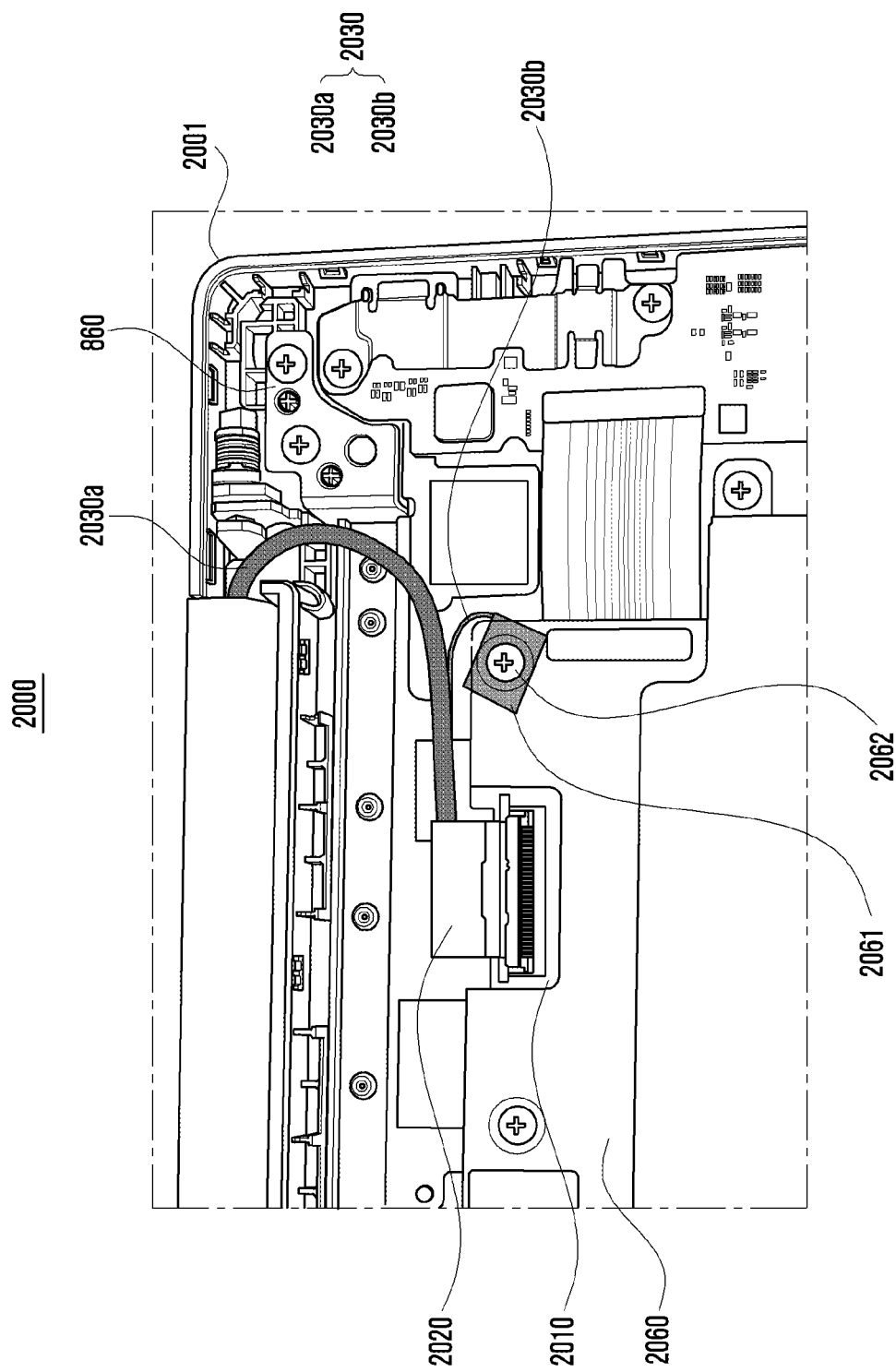
FIG. 20 is a view illustrating an example electronic device according to various embodiments of the disclosure.

FIG. 20 is a view illustrating an example electronic device according to various embodiments of the disclosure.

Referring to FIG. 20, an electronic device 2000 according to various embodiments of the disclosure may include a first housing 2001, a second housing (for example, the second housing 802 in FIG. 8), a hinge structure 860 (for example, the hinge structure 860 in FIG. 8), and a battery (for example, the battery 870 in FIG. 8). According to an embodiment, a first printed circuit board 2010 (for example, the first printed circuit board 820 in FIG. 8) (for example, a main PCB) may be disposed in a space formed by the first housing 2001. The first printed circuit board 2010 (for example, a main PCB) may have multiple electronic elements (for example, a processor, a communication module, a memory, a sensor module, an input device (for example, a keyboard), an interface, an audio module, a power management module, a battery, and an indicator) arranged thereon. The input device may be disposed to be visible to the outside. According to an embodiment, a display (for example, the display 810 in FIG. 8), a second printed circuit board (for example, the second printed circuit board 830 in FIG. 8) (for example, a display PCB), and a camera module (for example, the camera module 180 in FIG. 1) may be arranged in a space formed by the second housing (for example, the second housing 802 in FIG. 8). The display 810 may be disposed to be visible to the outside. The second printed circuit board 830 (for example, a display PCB) may have a display driver IC (for example, the display driver IC 230 in FIG. 2) disposed thereon.

According to an embodiment, the hinge structure 860 may physically connect the first housing 2001 and the second housing (for example, the second housing 802 in FIG. 8). The second housing (for example, the second housing 802 in FIG. 8) disposed on the upper part (for example, z-axis in FIG. 5A) of the first housing 2001 may be folded or unfolded by the hinge structure 860. In addition, the first housing 2001 disposed on the lower part (for example, −z-axis in FIG. 5A) of the second housing (for example, the second housing 802 in FIG. 8) may be folded or unfolded by the hinge structure 860. For example, the hinge structure 860 may be electrically connected to a ground terminal of the first printed circuit board 2010 (for example, a main PCB) and/or the second printed circuit board 830 (for example, a display PCB). A heat dissipation member 2060 for dissipating heat may be disposed on the first printed circuit board 2010.

As an embodiment, a first side of the cable structure 2030 (for example, the cable structure 1330 in FIG. 16) may be electrically connected to a first connector 2020 of the first printed circuit board 2010 disposed in the first housing 2001. A second side of the cable structure 2030 (for example, the cable structure 1330 in FIG. 16) may be electrically connected to a second connector (for example, the second connector 852 in FIG. 8) disposed in the second housing (for example, the second housing 802 in FIG. 8).

As an embodiment, a conductive member 2061 may be disposed on the heat dissipation member 2060 and the heat dissipation member 2060 and the conductive member 2061 may be electrically connected and coupled to each other. A second cable 2030b (for example, the second cable 1330b in FIG. 13) branched off from a first cable 2030a (for example, the first cable 1330a in FIG. 13) of the cable structure 2030 (for example, the cable structure 1330 in FIG. 16) may be electrically connected to the conductive member 2061. For another example, the first cable 2030a (for example, the first cable 1330a in FIG. 13) and the second cable 2030b (for example, the second cable 1330b in FIG. 13) may be formed as separate cables. For example, the first cable 2030a (for example, the first cable 1330a in FIG. 13) and the second cable 2030b (for example, the second cable 1330b in FIG. 13) may be formed as a shielding cable to be seen as one cable from the outside.

The cable structure 2030 (for example, the cable structure 1330 in FIG. 16) may be electrically connected to the heat dissipation member 2060 and thus the cable structure 2030 may be grounded to the heat dissipation member 2060.

Figure 21A:
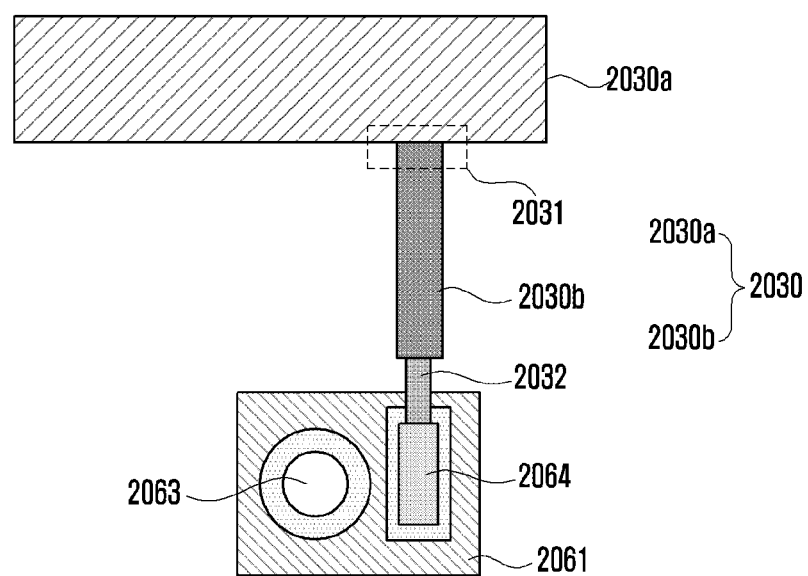
FIGS. 21A, 21B, and 21C are views illustrating an example structure in which cable structure (for example, a display cable) is grounded to a heat dissipation member according to various embodiments of the disclosure.
Figure 21B:
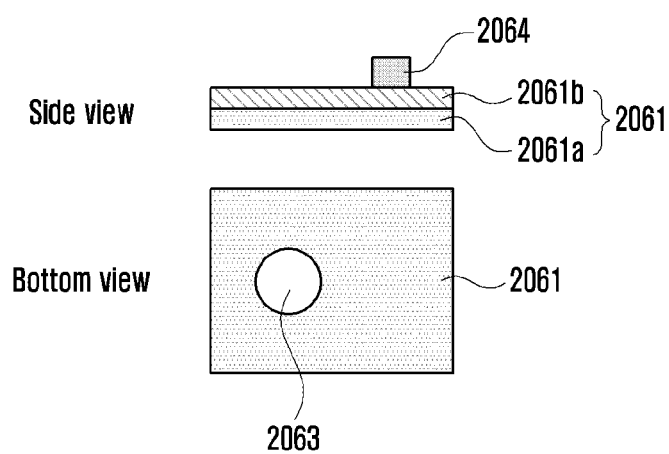
Figure 21C:
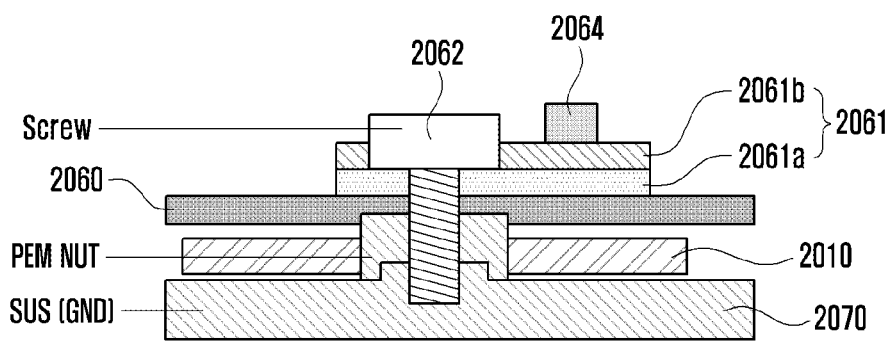

FIGS. 21A, 21B, and 21C are views illustrating a structure in which an example cable structure (for example, a display cable) is grounded to a heat dissipation member according to various embodiments of the disclosure.

Referring to FIG. 20 and FIGS. 21A, 21B, and 21C, a cable structure 2030 (for example, the cable structure 850 in FIG. 8 and FIG. 10) may include a first cable 2030a (for example, a main cable and a display cable) (for example, the first cable 1330a in FIG. 13) and a second cable 2030b (for example, a sub cable and a ground cable) (for example, the second cable 1330b in FIG. 13). For example, the second cable 2030b may be branched off from the first cable 2030a at a cable branching section 2031 (for example, the cable branching section 855 in FIG. 9 and FIG. 10) forming a substantially straight line.

As an embodiment, the conductive member 2061 may be electrically connected and coupled on the heat dissipation member 2060. For example, the conductive member 2061 may include a conductive sheet 2061a, a cover layer 2061b, and a solder pad 2064. At least one ground wire 2032 of the second cable 2030b (for example, a sub cable and a ground cable) may be electrically connected to the solder pad 2064 of the conductive member 2061.

For example, the conductive member 2061 may have a hole 2063 formed therein and the conductive member 2061 and the heat dissipation member 2060 may be electrically connected and coupled to each other by inserting a fastening member 2062 (for example, a screw) into the hole 2063. A first printed circuit board 2010 may be disposed under the heat dissipation member 2060 and a metallic housing 2070 (for example, the first housing 801 and the second housing 802 in FIG. 8) may be disposed under the printed circuit board 2010. The heat dissipation member 2060 and the metallic housing 2070 may be electrically connected and coupled to each other by a fastening member 2062.

The electronic device 2000 according to various embodiments of the disclosure may shorten a ground path of the cable structure 2030 by grounding the cable structure 2030 to the heat dissipation member 2060. When the ground path of the cable structure 2030 is shortened, a frequency band of parasitic resonance occurring in the cable structure 2030 (for example, the display cable) may be moved to an out band (for example, 1,000-1,500 MHz designated as 720 in FIG. 7B). The movement of the frequency band of the parasitic resonance occurring in the cable structure 2030 (for example, a display cable) may prevent performance degradation of the first communication module (for example, the first communication module 841 in FIG. 8) and the second communication module (for example, the second communication module 842 in FIG. 8) (for example, a radio frequency (RF) module).

An electronic device (for example, the electronic device 800 in FIG. 8) according to various embodiments of the disclosure may include a first housing (for example, the first housing 801 in FIG. 8) on which a first printed circuit board (for example, the first printed circuit board 820 in FIG. 8) including a processor (for example, the processor 120 in FIG. 1) is disposed, a second housing (for example, the second housing 802 in FIG. 8) on which a second printed circuit board (for example, the second printed circuit board 830 in FIG. 8) including a display (for example, the display 810 in FIG. 8) and a display driver (for example, the display driver IC 230 in FIG. 2) is disposed, a hinge structure (for example, the hinge structure 860 in FIG. 8) configured to physically connect the first housing 801 and the second housing 802 such that the first housing 801 and the second housing 802 are folded/unfolded, and a cable structure (for example, the cable structure 850 in FIG. 8 and the cable structure 1300 in FIG. 13) configured to electrically connect the first printed circuit board 820 and the second printed circuit board 830 via the hinge structure 860. The cable structure 850 and 1300 may include a first cable (for example, the first cable 850a in FIG. 8 and the first cable 1330a in FIG. 13) configured to transfer display signals and a second cable (for example, the second cable 850b in FIG. 8 and the second cable 1330b in FIG. 13) branched off from the first cable 850a and 1330a to be grounded to the hinge structure 860.

According to an embodiment, the cable structure 850 and 1300 may include a cable branching section (for example, the cable branching section 855 in FIG. 9) forming a substantially straight line. The second cable 850b and 1330b may be branched off from the first cable 850a and 1330a at a cable branching section (for example, the cable branching section 855 in FIG. 9).

According to an embodiment, the hinge structure 860 may be electrically connected to a ground terminal of the first printed circuit board 820 and/or a ground terminal of the second circuit board 830.

According to an embodiment, the hinge structure 860 may include a conductive member 1120. The second cable 850b and 1330b may be electrically connected to the conductive member (for example, the conductive member 1120 in FIG. 11A).

According to an embodiment, the conductive member 1120 may include a conductive sheet and a solder pad 1121 disposed on the conductive sheet. The second cable 850b and 1330b may be electrically connected to the solder pad 1121.

According to an embodiment, the first cable 850a and 1330a may include multiple wires for power, display signal, and control signal transfer, and a first ground wire. The second cable 850b and 1330b may include a second ground wire (for example, the second ground wire 856 in FIG. 9).

According to an embodiment, a first connector (for example, the first connector 851 in FIG. 8 and FIG. 9) electrically connected to the first printed circuit board 820 and a second connector (for example, the second connector 852 in FIG. 8 and FIG. 9) electrically connected to the second printed circuit board 830 may be included. A first side of the first ground wire may be electrically connected to a first ground terminal of the first connector 851. A second side of the first ground wire may be electrically connected to a first ground terminal of the second connector 852. A first side of the second ground wire 856 may be electrically connected to a second ground terminal of the first connector 851. A second side of the second ground wire 856 may be electrically connected to the conductive member 1120.

According to an embodiment, the second cable 850b and 1330b may be branched off from a portion adjacent to the first connector 851 among the first connector 851 and the second connector 852.

According to an embodiment, a hole (for example, the hole 1122 in FIG. 11B) extending through the conductive member 1120 and the hinge structure 860 may be formed. A fastening member (for example, the fastening member 1140 in FIG. 11C) may be inserted into the hole 1122. The hinge structure 860 and the conductive member 1120 may be electrically connected and coupled to each other by the fastening member 1140.

According to an embodiment, the cable structure 850 and 1300 may cause parasitic resonance frequency of 1,000-1,500 MHz band when the display is driven.

An electronic device 2000 according to various embodiments of the disclosure may include a first housing 2001 on which a first printed circuit board 820 including a processor 120 is disposed, a heat dissipation member 2060 disposed on the first housing 2001 so as to dissipate heat of the first printed circuit board 2010, a second housing (for example, the second housing 802 in FIG. 8) on which a second printed circuit board (for example, the second printed circuit board 830 in FIG. 8) including a display (for example, the display 810 in FIG. 8) and a display driver (for example, the display driver IC 230 in FIG. 2) is disposed, a hinge structure (for example, the hinge structure 860 in FIG. 20) configured to physically connect the first housing 801 and the second housing 802 such that the first housing 801 and the second housing 802 are folded/unfolded, and a cable structure (for example, the cable structure 1300 in FIG. 13 and the cable structure 2030 in FIG. 20) configured to electrically connect the first printed circuit board 820 and the second printed circuit board 830 via the hinge structure 860. The cable structure 1300 and 2030 may include a first cable (for example, the first cable 1330a in FIG. 13 and the first cable 2030a in FIG. 20) configured to transfer display signals and a second cable (for example, the second cable 1330b in FIG. 13 and the second cable 2030b in FIG. 20) branched off from the first cable 1330a and 2030a to be grounded to the heat dissipation member 2060.

According to an embodiment, the cable structure 1300 and 2030 may include a cable branching section (for example, the cable branching section 855 in FIG. 9) forming a substantially straight line. The second cable 1330b and 2030b may be branched off from the first cable 1330a and 2030a at the cable branching section (for example, the cable branching section 855 in FIG. 9).

According to an embodiment, the heat dissipation member 2060 may be electrically connected to a ground terminal of the first printed circuit board 2010 and/or a ground terminal of the second circuit board 830.

According to an embodiment, the heat dissipation member 2060 may include a conductive member (for example, the conductive member 2061 in FIG. 20). The second cable 1330b and 2030b may be electrically connected to the conductive member 2061.

According to an embodiment, the conductive member 2061 may include a conductive sheet and a solder pad disposed on the conductive sheet. The second cable 1330b and 2060b may be electrically connected to the solder pad.

According to an embodiment, the first cable 1330a and 2030a may include multiple wires for power, display signal, and control signal transfer, and a first ground wire. The second cable 1330b and 2030b may include a second ground wire.

According to an embodiment, a first connector 2020 electrically connected to the first printed circuit board 2010 and a second connector (for example, the second connector 852 in FIG. 8) electrically connected to the second printed circuit board 830 may be included. A first side of the first ground wire may be electrically connected to a first ground terminal of the first connector 2020. A second side of the first ground wire may be electrically connected to a first ground terminal of the second connector 852. A first side of the second ground wire may be electrically connected to a second ground terminal of the first connector 2020. A second side of the second ground wire may be electrically connected to the conductive member 2061.

According to an embodiment, the second cable 1330b and 2030b may be branched off from a portion adjacent to the first connector 2020 among the first connector 2020 and the second connector 852.

According to an embodiment, a hole (for example, the hole 2063 in FIG. 21A) extending through the conductive member 2061 and the heat dissipation member 2060 may be formed. A fastening member 2062 may be inserted into the hole 2063. The heat dissipation member 2060 and the conductive member 1120 may be electrically connected and coupled to each other by the fastening member 2062.

According to an embodiment, the cable structure 1300 and 2030 may cause parasitic resonance frequency of 1,000-1,500 MHz band when the display is driven.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a first housing in which a first printed circuit board (PCB) comprising a processor is disposed;
a second housing in which a second PCB including a display driver and display is disposed;
a hinge structure including a hinge rotating section and configured to physically connect the first housing and the second housing such that the first housing and the second housing are foldable/unfoldable; and
a cable structure configured to electrically connect the first PCB and the second PCB via the hinge structure,
wherein the cable structure comprises a first cable configured to transfer display signals to the second PCB and a second cable branched off from the first cable at a cable branching section between the first PCB and the hinge rotating section for grounding to the hinge structure.

2. The electronic device of claim 1,
wherein the cable branching section comprises a substantially straight portion of the cable structure.

3. The electronic device of claim 2,
wherein the hinge structure is electrically connected to at least one of a ground terminal of the first PCB or a ground terminal of the second PCB.

4. The electronic device of claim 3,
wherein the hinge structure comprises a conductive member, and
wherein the second cable is electrically connected to the conductive member.

5. The electronic device of claim 4,
wherein the conductive member comprises a conductive sheet and a solder pad disposed on the conductive sheet, and
wherein the second cable is electrically connected to the solder pad.

6. The electronic device of claim 4,
wherein the first cable comprises multiple wires for power, display signal, and control signal transfer, and a first ground wire,
wherein the second cable comprises a second ground wire.

7. The electronic device of claim 6, comprising:
a first connector electrically connected to the first PCB; and
a second connector electrically connected to the second PCB,
wherein a first side of the first ground wire is electrically connected to a first ground terminal of the first connector,
wherein second side of the first ground wire is electrically connected to a first ground terminal of the second connector,
wherein a first side of the second ground wire is electrically connected to a second ground terminal of the first connector, and
wherein a second side of the second ground wire is electrically connected to the conductive member.

8. The electronic device of claim 7,
wherein the cable branching section is between the first connector and the hinge rotating section.

9. The electronic device of claim 4, further comprising:
a hole formed to extend through the conductive member and the hinge structure, and a fastening member disposed in the hole, wherein the hinge structure and the conductive member are electrically connected and coupled to each other by the fastening member.

10. The electronic device of claim 3, wherein the cable structure is configured to that a parasitic resonance frequency in a 1,000-1,500 MHz band occurs when the display is driven.

11. An electronic device comprising:

a first housing in which a first printed circuit board (PCB) comprising a processor is disposed;

a heat dissipation member disposed in the first housing for dissipating heat of the first printed circuit board;

a second housing in which a second PCB comprising a display driver for a display is disposed;

a hinge structure including a hinge rotating section and configured to physically connect the first housing and the second housing such that the first housing and the second housing are foldable/unfoldable; and a cable structure configured to electrically connect the first PCB and the second PCB via the hinge structure, wherein the cable structure comprises a first cable configured to transfer display signals to the second PCB and a second cable branched off from the first cable at a cable branching section between the first PCB and the hinge rotating section for grounding to the heat dissipation member.

12. The electronic device of claim 11, wherein the cable branching section comprises a substantially straight portion of the cable structure.

13. The electronic device of claim 12, wherein the heat dissipation member is electrically connected to at least one of a ground terminal of the first PCB or a ground terminal of the second PCB.

14. The electronic device of claim 13, wherein the heat dissipation member comprises a conductive member, and wherein the second cable is electrically connected to the conductive member.

15. The electronic device of claim 14, wherein the conductive member comprises a conductive sheet and a solder pad disposed on the conductive sheet, and wherein the second cable is electrically connected to the solder pad.

16. The electronic device of claim 14, wherein the first cable comprises multiple wires for power, display signal, and control signal transfer, and a first ground wire, wherein the second cable comprises a second ground wire.

17. The electronic device of claim 16, comprising:

a first connector electrically connected to the first PCB; and a second connector electrically connected to the second PCB, wherein a first side of the first ground wire is electrically connected to a first ground terminal of the first connector, wherein second side of the first ground wire is electrically connected to a first ground terminal of the second connector, wherein a first side of the second ground wire is electrically connected to a second ground terminal of the first connector, and wherein a second side of the second ground wire is electrically connected to the conductive member.

18. The electronic device of claim 17, wherein the cable branching section is between the first connector and the hinge rotating section.

19. The electronic device of claim 14, further comprising:

a hole formed to extend through the conductive member and the heat dissipation member, and a fastening member disposed in the hole, wherein the heat dissipation member and the conductive member are electrically connected and coupled to each other by the fastening member.

20. The electronic device of claim 13, wherein the cable structure is configured so that a parasitic resonance frequency in a 1,000-1,500 MHz band occurs when the display is driven.

* * * * *